(12) United States Patent
Mitsuishi et al.

(10) Patent No.: US 7,935,978 B2
(45) Date of Patent: May 3, 2011

(54) LIGHT EMITTING DEVICE AND METHOD FOR MANUFACTURING THE SAME

(75) Inventors: Iwao Mitsuishi, Tokyo (JP); Shinya Nunoue, Ichikawa (JP); Yasushi Hattori, Kawasaki (JP); Kuniaki Konno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/401,692

(22) Filed: Mar. 11, 2009

(65) Prior Publication Data

US 2010/0051988 A1   Mar. 4, 2010

(30) Foreign Application Priority Data

Aug. 28, 2008   (JP) .................................. 2008-219393

(51) Int. Cl.
  *H01L 33/00* (2010.01)
  *H01L 27/15* (2010.01)
  *H01L 31/12* (2010.01)
(52) U.S. Cl. ............... 257/98; 257/79; 257/99; 257/100
(58) Field of Classification Search .................... 257/98, 257/99, 100, 79, 80, 82, 88, 89, 95, 290
See application file for complete search history.

(56) References Cited

U.S. PATENT DOCUMENTS

| | | | | |
|---|---|---|---|---|
| 7,084,435 B2 * | 8/2006 | Sugimoto et al. | ................ | 257/99 |
| 7,294,861 B2 * | 11/2007 | Schardt et al. | .................. | 257/81 |
| 2007/0228390 A1 | 10/2007 | Hattori et al. | | |
| 2009/0058256 A1 | 3/2009 | Mitsuishi et al. | | |

FOREIGN PATENT DOCUMENTS

| | | |
|---|---|---|
| JP | 5-25749 | 4/1993 |
| JP | 10-190058 | 7/1998 |
| JP | 11-170605 | 6/1999 |
| JP | 2001-148514 | 5/2001 |
| JP | 2002-353595 | 12/2002 |
| JP | 2003-4641 | 1/2003 |
| JP | 2004-267437 | 9/2004 |
| JP | 2007-73968 | 3/2007 |
| JP | 3941826 | 4/2007 |
| JP | 2007-273562 | 10/2007 |
| JP | 2008-518461 | 5/2008 |

* cited by examiner

*Primary Examiner* — Chuong A. Luu
(74) *Attorney, Agent, or Firm* — Oblon, Spivak, McClelland, Maier & Neustadt, L.L.P.

(57) ABSTRACT

A light emitting device includes: a substrate having a concave portion formed on a surface thereof; a light emitting element emitting a first light which is a blue light or a near-ultraviolet light; a resin sheet being a deformable resin sheet formed on the substrate so as to cover the light emitting element; a first transmissive layer formed in a hemispherical shape on the first region of the resin sheet, and transmitting the first light; a color conversion layer including a fluorescent material that converts the first light into a second light of a different wavelength from that of the first light and a transmissive material that transmits the first light, the color conversion layer covering the first transmissive layer in such a manner that an end portion reaches an upper face of the resin sheet; and a second transmissive layer covering the color conversion layer in such a manner that an end portion reaches the upper face of the resin sheet, and transmitting the first light and the second light.

14 Claims, 7 Drawing Sheets

WHITE LIGHT

WHITE LIGHT

LIGHT EMITTING DEVICE AND METHOD FOR MANUFACTURING THE SAME

CROSS-REFERENCE TO RELATED APPLICATION

This application is based upon and claims the benefit of priority from prior Japanese Patent Application No. 2008-219393 filed on Aug. 28, 2008 in Japan, the entire contents of which are incorporated herein by reference.

BACKGROUND OF THE INVENTION

1. Field of the Invention

The present invention relates to a light emitting device that includes LEDs emitting short-wavelength visible light and a fluorescent material absorbing the visible light and emitting fluorescent light of a longer wavelength than the absorbed light, and emits white light or intermediate-color light. The present invention also relates to a method for manufacturing the light emitting device.

2. Related Art

In recent years, attention is drawn to so-called white LEDs that are formed by combining blue light emitting diodes (LED) with a yellow fluorescent material such as YAG doped with Ce. Each of such white LEDs emits white light with a single chip. Conventionally, LEDs emit light in a single color, such as red, green, or blue. To emit white light or intermediate-color light, LEDs that emit single-color light need to be used and driven. At present, however, such trouble is eliminated by combining light emitting diodes and a fluorescent material. Thus, white light can be obtained with a simple structure.

There has also been a suggested light emitting device that has a large number of LED chips mounted on a mounting substrate, and convex lenses formed at the portions where the blue LED chips are mounted. The convex lenses are formed with a light transmissive resin containing a diffused fluorescent material that absorbs blue light emitted from the blue LED chips and emit yellow light (see JP-A 2001-148514 (KOKAI), for example). In the light emitting device disclosed in JP-A 2001-148514 (KOKAI), the compounding ratio of the fluorescent material to the resin is determined in advance. Therefore, the compounding ratio of the fluorescent material cannot be adjusted in accordance with the light emission wavelengths of the LED chips, and variations in emission color cannot be reduced.

To reduce the variations in emission color, a light emitting device that has a color conversion material placed on each lens has been suggested. The color conversion material is molded into a dome-like shape, and is made of a light transmissive resin containing a fluorescent material diffused at compounding ratios varied in accordance with the emission wavelength of the LED chips (see Japanese Patent Publication No. 3,941,826, for example). In the light emitting device disclosed in Japanese Patent Publication No. 3,941,826, however, an air layer is provided between the lens and the color conversion material. Therefore, light loss due to total reflection at the interface between the lens and the color conversion material containing a fluorescent material cannot be prevented, and it is difficult to output high-intensity light with high luminance efficiency. Furthermore, with the air layer, reductions in the light transmission rate of the resin and the luminance efficiency of the fluorescent material cannot be avoided.

To counter this problem, a light emitting device that outputs high-intensity light with high luminance efficiency has been suggested as a structure having LED chips and fluorescent layers mounted thereon without an air layer (see JP-A 2007-273562 (KOKAI), for example). The light emitting device disclosed in JP-A 2007-273562 (KOKAI) has a dome-like multi-layer structure that includes: a substrate that has a flat face on which a semiconductor light emitting element is to be mounted; the semiconductor light emitting element that is mounted on the flat face of the substrate, and emits light within the range of ultraviolet light to visible light; a first light transmissive layer that is formed on the substrate and covers the semiconductor light emitting element; a fluorescent material layer that is formed on the first light transmissive layer, has an end portion reaching the flat face of the substrate, and contains a fluorescent material and a base material; and a second light transmissive layer that is formed on the fluorescent material layer, and has an end portion reaching the flat face of the substrate. However, the light emitting device disclosed in JP-A 2007-273562 (KOKAI) is formed on a flat-type mounting substrate. Therefore, it is difficult to provide particular distributions to the emission patterns.

As described above, a conventional light emitting device that can output white light has an air layer between each lens and a color conversion material. Therefore, light loss due to total reflection at the interface between the lens and the color conversion material containing a fluorescent material cannot be prevented, and it is difficult to output high-intensity light with high luminance efficiency. Furthermore, with the air layer, the transmission rate of the resin and the luminance efficiency of the fluorescent material might deteriorate. Also, since the mounting substrate for the LEDs is of a flat type, it is difficult to provide particular distributions to emission patterns.

SUMMARY OF THE INVENTION

The present invention has been made in view of these circumstances, and an object thereof is to provide a light emitting device that can have particular distributions in emission patterns, and minimize reductions in the resin transmission rate and the luminance efficiency of the fluorescent material. Such a light emitting device can output high-intensity light with highest possible luminance efficiency. Another object of the present invention is to provide a method for manufacturing such a light emitting device.

A light emitting device according to a first aspect of the present invention includes: a substrate that has a concave portion formed on a surface thereof; a light emitting element that is sealed in the concave portion of the substrate by resin, and emits a first light which is a blue light or a near-ultraviolet light; a resin sheet that is a deformable resin sheet formed on the substrate so as to cover the light emitting element sealed in the concave portion by the resin, the resin sheet having a first region which transmits the first light; a first transmissive layer that is formed in a hemispherical shape on the first region of the resin sheet, and transmits the first light; a color conversion layer that includes a fluorescent material that converts the first light into a second light of a different wavelength from that of the first light and a transmissive material that transmits the first light, the color conversion layer covering the first transmissive layer in such a manner that an end portion reaches an upper face of the resin sheet; and a second transmissive layer that covers the color conversion layer in such a manner that an end portion reaches the upper face of the resin sheet, and transmits the first light and the second light.

A light emitting device according to a second aspect of the present invention includes: a substrate that has a plurality of concave portions formed on a surface thereof; light emitting elements that are sealed in the concave portions of the substrate by resin, and emit first lights which are blue lights or near-ultraviolet lights; resin sheets that are deformable resin sheets formed on the substrate so as to cover each of the light emitting elements sealed in the concave portions by the resin, the resin sheets having first regions which transmit the first lights; first transmissive layers that are formed in hemispherical shapes on the first regions of the resin sheet, and transmit the first lights; color conversion layers that include a fluorescent material that converts the first lights into second lights of different wavelengths from those of the first lights and a transmissive material that transmits the first lights, the color conversion layers covering the first transmissive layers in such a manner that each end portion reaches an upper face of the resin sheet; and second transmissive layers that cover the color conversion layers in such a manner that each end portion reaches the upper face of the resin sheet, and transmit the first lights and the second lights.

A method for manufacturing a light emitting device according to a third aspect of the present invention includes: sealing light emitting elements in concave portions formed on a surface of a substrate by resin, the light emitting elements emitting first lights which are blue lights or near-ultraviolet lights; forming hemispherical first transmissive layers on first regions of a deformable resin sheet, the first transmissive layers transmitting the first lights, the first regions transmitting the first lights; forming color conversion layers that include a fluorescent material that converts the first lights into second lights of different wavelengths from those of the first lights and a transmissive material that transmits the first lights, the color conversion layers covering the first transmissive layers in such a manner that each end portion reaches an upper face of the resin sheet; forming second transmissive layers that cover the color conversion layers in such a manner that each end portion reaches the upper face of the resin sheet, and transmit the first lights and the second lights; and bonding the resin sheet having stack films formed with the first transmissive layers, the color conversion layers, and the second transmissive layers, to the substrate, the stack films being located on the light emitting elements.

DETAILED DESCRIPTION OF THE INVENTION

The following is a description of embodiments of the present invention, with reference to the accompanying drawings.

First Embodiment

Figure 1:
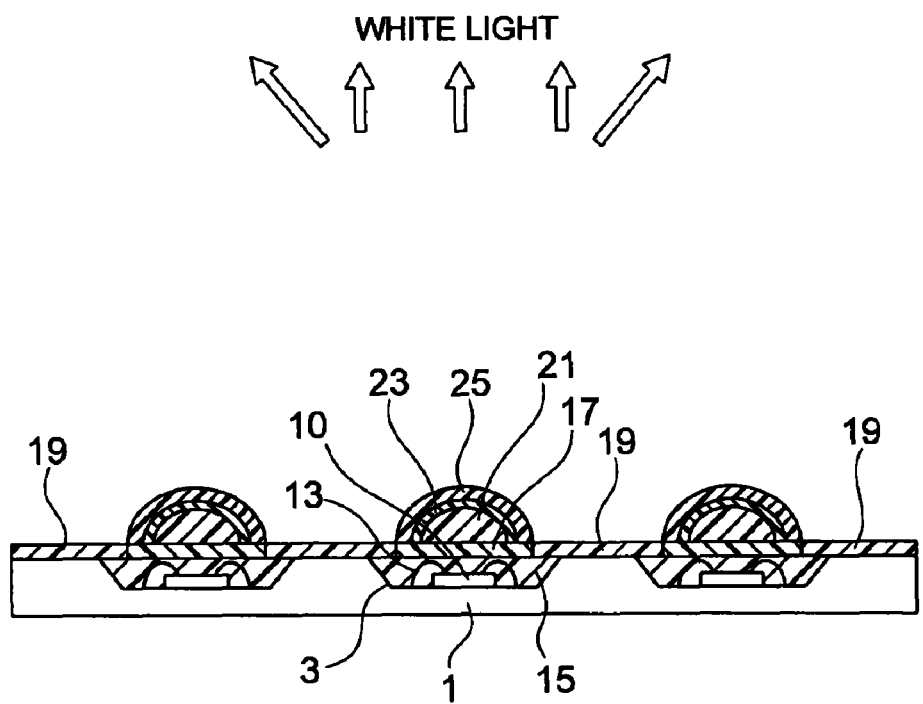
FIG. 1 is a cross-sectional view of a light emitting device in accordance with a first embodiment.

FIG. 1 is a cross-sectional view of a light emitting device in accordance with a first embodiment of the present invention. The light emitting device of this embodiment has excitation light source blue LED chips 10 mounted on a flat-type substrate 1. The substrate 1 has concave portions 3 formed therein. Each of the LED chips 10 is placed in each corresponding concave portion 3 of the substrate 1. The LED chips 10 in the concave portions 3 are connected to wiring lines (not shown) via wires 13. A drive current is supplied from outside to the LED chips 10 via the wiring lines, so that the LED chips 10 emit excitation blue light. Each of the LED chips 10 is sealed in each corresponding concave portion 3 with a transparent resin 15. A deformable transparent resin sheet 17 is placed immediately above each LED chip 10, so as to cover the region above the resin 15. A reflection layer 19 is placed on the regions of the substrate 1 other than the regions on which the resin sheet 17 is provided. A material that reflects light in the near-ultraviolet to visible range, such as Ag particles or titanium oxide particles, is diffused in a resin of the reflection layer 19. Hemispherical transparent resin layers 21 are placed on the resin sheet 17. Each resin layer 21 is formed so that the center of the hemisphere of the hemispherical resin layer 21 is substantially located on the center line of the corresponding LED chip 10 that is substantially perpendicular to the upper face of the LED chip 10. A color conversion layer 23 is provided to cover the hemispherical resin layer 21. In the color conversion layer 23, a fluorescent material that absorbs and converts blue light generated from the LED chip 10 into yellow light is diffused in a transparent resin. A transparent resin layer 25 is further provided to cover the color conversion layer 23. The outer surface of the resin layer 25 is in contact with the atmosphere (the air), and has a function to restrict total reflection of the blue light emitted from the LED chip 10 and the yellow light from the color conversion layer 23 by the outer surface that is the interface with the atmosphere. The three-layer stack film formed with the resin layer 21, the color conversion layer 23, and the resin layer 25 has a hemispherical shape.

When a current is applied to the LED chips 10 in the light emitting device of this embodiment, the light that is output from the resin layers 25 is white light formed with the blue light emitted from the LED chips 10 and transmitted through the resin layer 21, the color conversion layer 23, and the resin layer 25, and the yellow light emitted from the color conversion layer 23.

In the light emitting device of this embodiment having the above structure, a hemispherical stack structure including the resin layer 21 that transmits the blue light emitted from the LED chip 10, the color conversion layer 23 that has a diffused fluorescent material converting the blue light into yellow light in a transparent resin, and the resin layer 25 that functions to restrict total reflection of the blue light and the yellow light on the outer surface serving as the interface with the atmosphere is formed on the resin sheet 17. Accordingly, variations of emitted light color and variations of shades observed from different angles can be restricted, and the excitation light emitted from the LED chips 10 can be gathered. Thus, the light extraction efficiency can be made higher. Also, an air layer can be prevented from existing between each two layers. Accordingly, reductions in the transmissivity of the resin and the luminance efficiency of the fluorescent material can be made as small as possible.

In the light emitting device of this embodiment, the reflection layer 19 that has a diffused material, in the resin, reflecting light in the near-ultraviolet to visible range is provided in the regions other than the regions of the hemispherical stack structures each including the resin layer 21, the color conversion layer 23, and the resin layer 25. The resin layer 25 has a function to restrict total reflection of the blue light and the yellow light on the outer surface that serves as the interface with the atmosphere. Accordingly, high-intensity light can be output with a highest possible luminance efficiency. If heat-radiating filler is also diffused in the reflection layer 19, higher heat-radiation performance can be achieved.

As will be described later in second through fourth embodiments, since a hemispherical stack structure including the resin layer 21, the color conversion layer 23, and the resin layer 25 is formed on the resin sheet 17, the shape of the substrate 1 is not limited to a flat shape, and the stack structure may be formed on a curved surface. Accordingly, particular distributions can be observed in the emission patterns.

Figure 2:
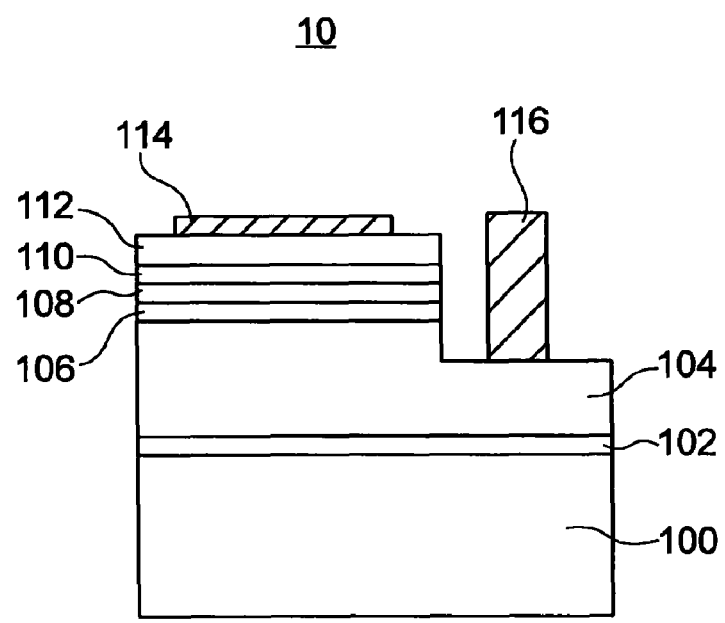
FIG. 2 is a cross-sectional view showing a first specific example of a LED in accordance with the present invention.

Next, specific examples of the LED chips 10 that emit blue light in accordance with this embodiment are described. FIG. 2 shows a first specific example of a LED chip. The LED chip 10 of the first specific example has a stack structure formed on a sapphire substrate 100. In this stack structure, a buffer layer 102, an n-type GaN layer 104, an n-type AlGaN layer 106, an InGaN-based activation layer 108, a p-type AlGaN layer 110, and a p-type GaN layer 112 are stacked in this order. A p-side electrode 114 is placed on the p-type GaN layer 112. The stack structure including the p-type GaN layer 112, the p-type AlGaN layer 110, the InGaN-based activation layer 108, and the n-type AlGaN layer 106 is partially removed by an etching technique, and the n-type GaN layer 104 is also partially removed by an etching technique, so as to form a concave portion. An n-side electrode 116 is placed on the n-type GaN layer 104 exposed through the bottom of the concave portion. Accordingly, the LED chip 10 of this specific example is of a face-up type, with the electrode face facing upward. A current flows from the p-side electrode 114 to the n-side electrode 116, passing through the p-type GaN layer 112, the p-type AlGaN layer 110, the InGaN-based activation layer 108, the n-type AlGaN layer 106, and the n-type GaN layer 104.

Figure 3:
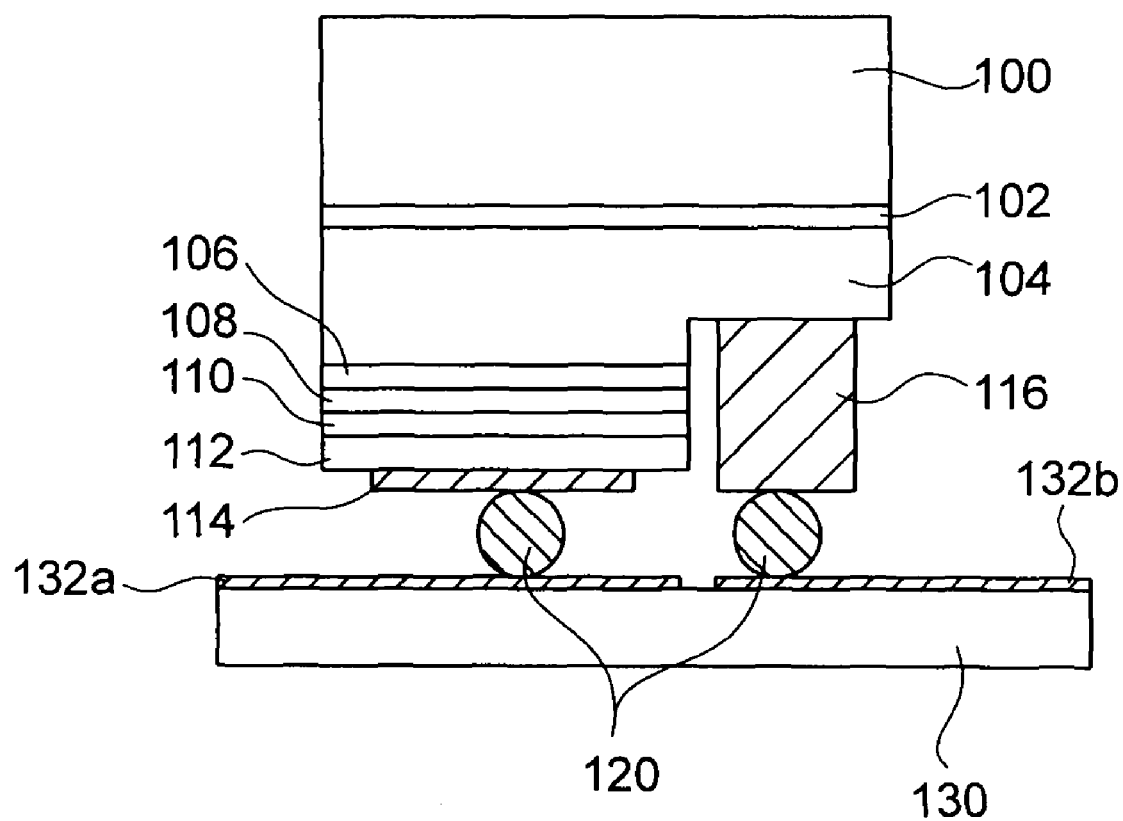
FIG. 3 is a cross-sectional view showing a second specific example of a LED in accordance with the present invention.

FIG. 3 shows a LED chip 10 of a second specific example. Although formed on a sapphire substrate 100, the electrode face of the LED chip 10 of the second specific example faces downward. More specifically, the LED chip 10 of the first specific example shown in FIG. 2 is turned upside down, and the p-side electrode 114 and the n-side electrode 116 are placed on a metallized mounting board 130 via bumps 120 made of Au, for example. Wiring layers 132a and 132b made of a metal are formed on the surface of the metallized mounting board 130.

Figure 4:
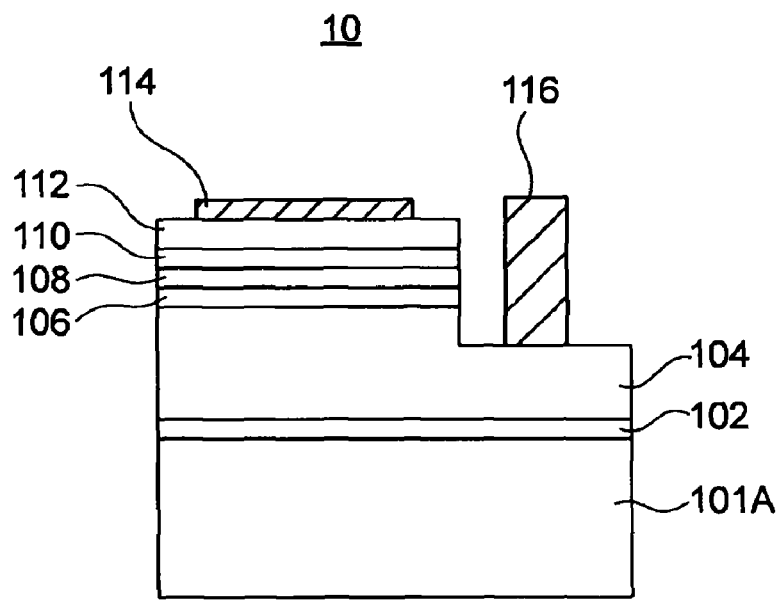
FIG. 4 is a cross-sectional view showing a third specific example of a LED in accordance with the present invention.

FIG. 4 shows a LED chip 10 of a third specific example. The LED chip 10 of the third specific example is the same as the LED chip 10 of the first specific example shown in FIG. 2, except that the sapphire substrate 100 is replaced with a silicon substrate 101A. More specifically, a stack structure is formed on the silicon substrate 101A. In the stack structure, a buffer layer 102, an n-type GaN layer 104, an n-type AlGaN layer 106, an InGaN-based activation layer 108, a p-type AlGaN layer 110, and a p-type GaN layer 112 are stacked in this order. A p-side electrode 114 is placed on the p-type GaN layer 112. The stack structure including the p-type GaN layer 112, the p-type AlGaN layer 110, the InGaN-based activation layer 108, and the n-type AlGaN layer 106 is partially removed by an etching technique, and the n-type GaN layer 104 is also partially removed by an etching technique, so as to form a concave portion. An n-side electrode 116 is placed on the n-type GaN layer 104 exposed through the bottom of the concave portion.

Figure 5:
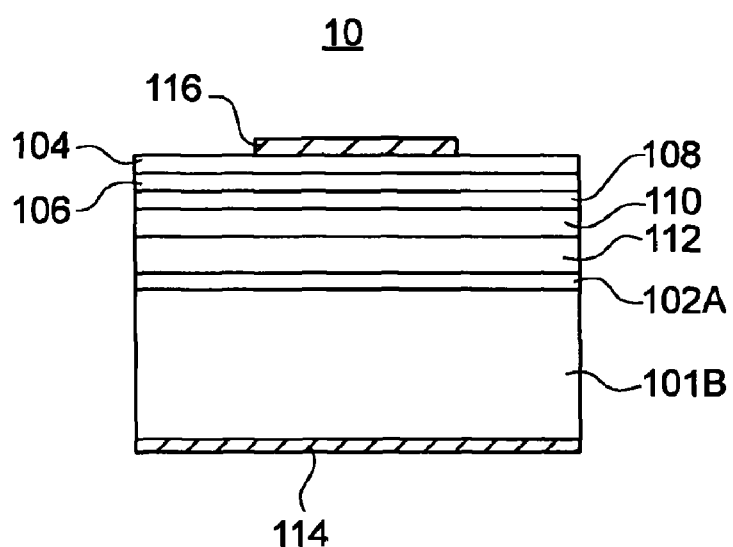
FIG. 5 is a cross-sectional view showing a fourth specific example of a LED in accordance with the present invention.

FIG. 5 shows a LED chip 10 of a fourth specific example. The LED chip 10 of the fourth specific example has a stack structure formed on a p-type silicon substrate 101B. In the stack structure, a buffer layer 102A, a p-type GaN layer 112, a p-type AlGaN layer 110, an InGaN-based activation layer 108, an n-type AlGaN layer 106, and an n-type GaN layer 104 are stacked in this order. An n-side electrode 116 is formed on the n-type GaN layer 104, and a p-side electrode 114 is placed on the opposite side of the p-type silicon substrate 101B from the buffer layer 102A.

Figure 6:
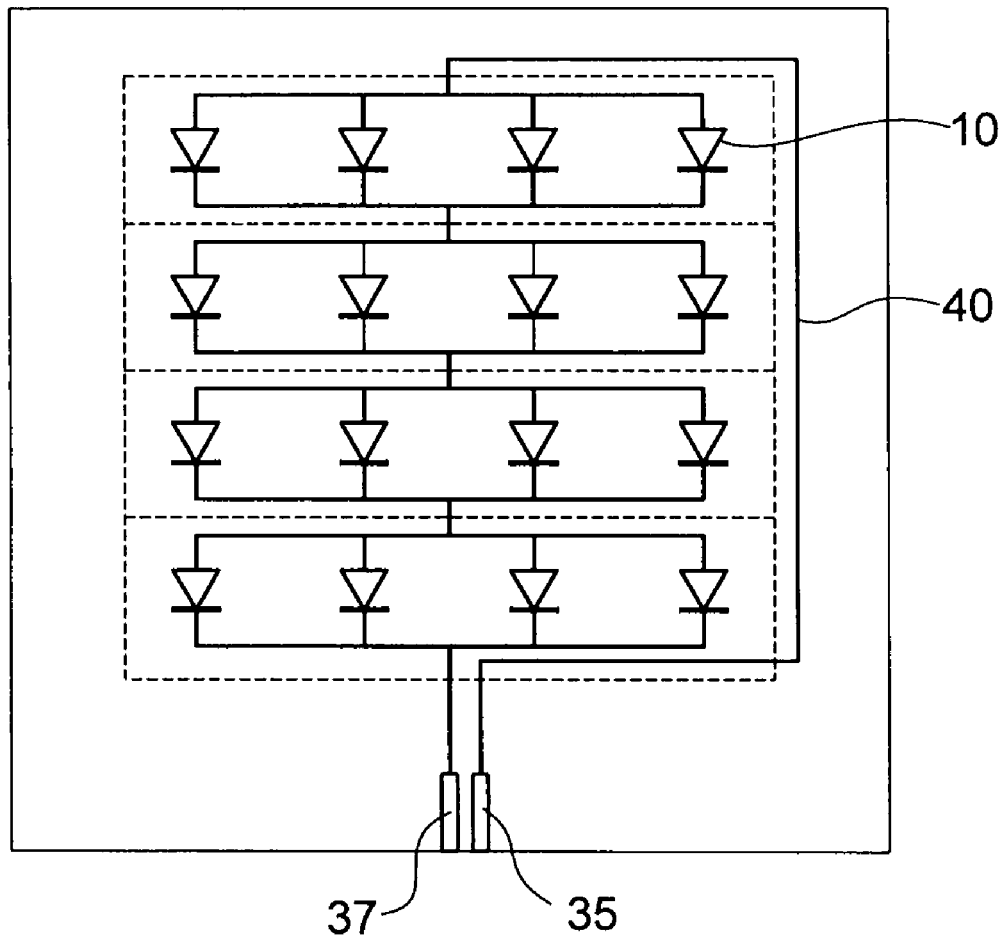
FIG. 6 is a circuit diagram showing connections of a LED in accordance with the present invention.

FIG. 6 shows a specific example of connections among LED chips 10 in accordance with this embodiment. The connection circuit of this specific example is a four-series, four-parallel circuit in which first through fourth parallel circuits each having four LED chips 10 connected in parallel are connected in series. A current that is input from an input terminal 35 flows to the outside, passing through a wiring line 40 made of a material such as Cu, the first parallel circuit, the second parallel circuit, the third parallel circuit, the fourth parallel circuit, and an output terminal 37.

Second Embodiment

Figure 7:
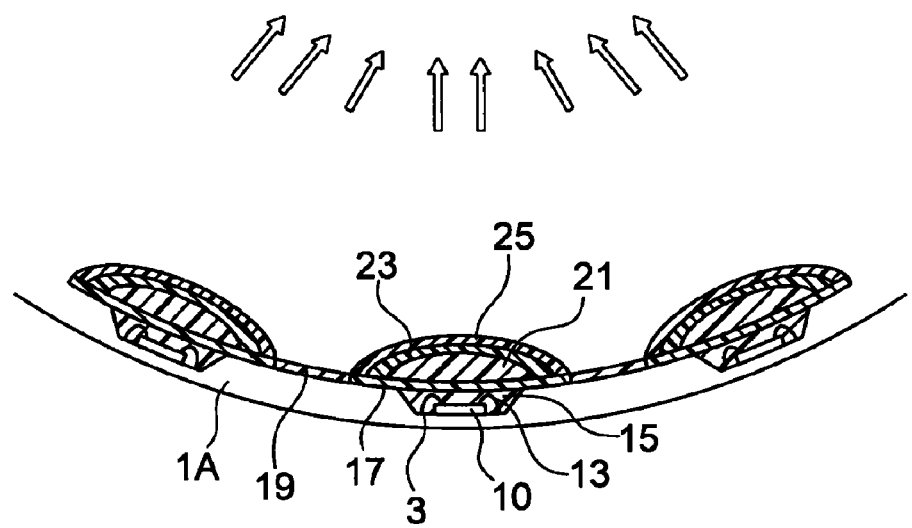
FIG. 7 is a cross-sectional view of a light emitting device in accordance with a second embodiment.

FIG. 7 shows a light emitting device in accordance with a second embodiment of the present invention. The light emitting device of this embodiment is the same as the light emitting device of the first embodiment shown in FIG. 1, except that the flat-type substrate 1 is replaced with a concavely-curved substrate 1A. The concavely-curved substrate 1A has concave portions 3 formed on the concavely-curved face side. Each LED chip 10 is resin-sealed in each corresponding concave portion 3. A deformable transparent resin sheet 17 is placed immediately above each LED chip 10, so as to cover the region above the resin 15. A reflection layer 19 is placed on the regions of the substrate 1 other than the regions on which the resin sheet 17 is provided. A material that reflects light in the near-ultraviolet to visible range, such as Ag particles or titanium oxide particles, is diffused in a resin of the reflection layer 19. Hemispherical transparent resin layers 21 are placed on the resin sheet 17. Each resin layer 21 is formed so that the center of the hemisphere of the hemispherical resin layer 21 is substantially located on the center line of the corresponding LED chip 10 that is substantially perpendicular to the upper face of the LED chip 10. A color conversion layer 23 is provided to cover the hemispherical resin layer 21. In the color conversion layer 23, a fluorescent material that absorbs and converts blue light generated from the LED chip 10 into yellow light is diffused in a transparent resin. A transparent resin layer 25 is further provided to cover the color conversion layer 23. The outer surface of the resin layer 25 is in contact with the atmosphere (the air), and has a function to restrict total reflection of the blue light emitted from the LED chip 10 and the yellow light from the color conversion layer 23 by the outer surface that is the interface with the atmosphere. The three-layer stack film formed with the resin layer 21, the color conversion layer 23, and the resin layer 25 has a hemispherical shape.

The light emitting device of the second embodiment can achieve the same effects as those of the first embodiment.

Third Embodiment

Figure 8:
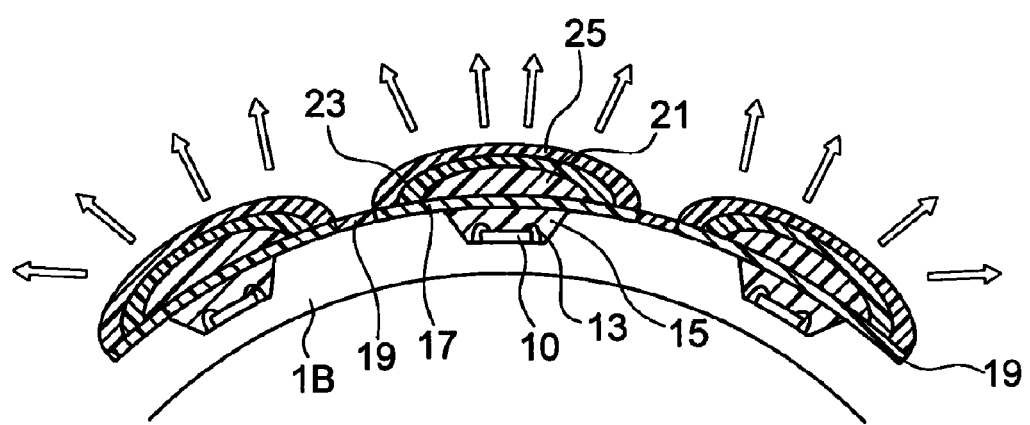
FIG. 8 is a cross-sectional view of a light emitting device in accordance with a third embodiment.

FIG. 8 shows a light emitting device in accordance with a third embodiment of the present invention. The light emitting device of this embodiment is the same as the light emitting device of the first embodiment shown in FIG. 1, except that the flat-type substrate 1 is replaced with a convexly-curved substrate 1B. The convexly-curved substrate 1B has concave portions 3 formed on the convexly-curved face side. Each LED chip 10 is resin-sealed in each corresponding concave portion 3. A deformable transparent resin sheet 17 is placed immediately above each LED chip 10, so as to cover the region above the resin 15. A reflection layer 19 is placed on the regions of the substrate 1 other than the regions on which the resin sheet 17 is provided. A material that reflects light in the near-ultraviolet to visible range, such as Ag particles or titanium oxide particles, is diffused in a resin of the reflection layer 19. Hemispherical transparent resin layers 21 are placed on the resin sheet 17. Each resin layer 21 is formed so that the center of the hemisphere of the hemispherical resin layer 21 is substantially located on the center line of the corresponding LED chip 10 that is substantially perpendicular to the upper face of the LED chip 10. A color conversion layer 23 is provided to cover the hemispherical resin layer 21. In the color conversion layer 23, a fluorescent material that absorbs and converts blue light emitted from the LED chip 10 into yellow light is diffused in a transparent resin. A transparent resin layer 25 is further provided to cover the color conversion layer 23. The outer surface of the resin layer 25 is in contact with the atmosphere (the air), and has a function to restrict total reflection of the blue light emitted from the LED chip 10 and the yellow light emitted from the color conversion layer 23 by the outer surface that is the interface with the atmosphere. The three-layer stack film formed with the resin layer 21, the color conversion layer 23, and the resin layer 25 has a hemispherical shape.

The light emitting device of the third embodiment can achieve the same effects as those of the first embodiment.

Fourth Embodiment

Figure 9:
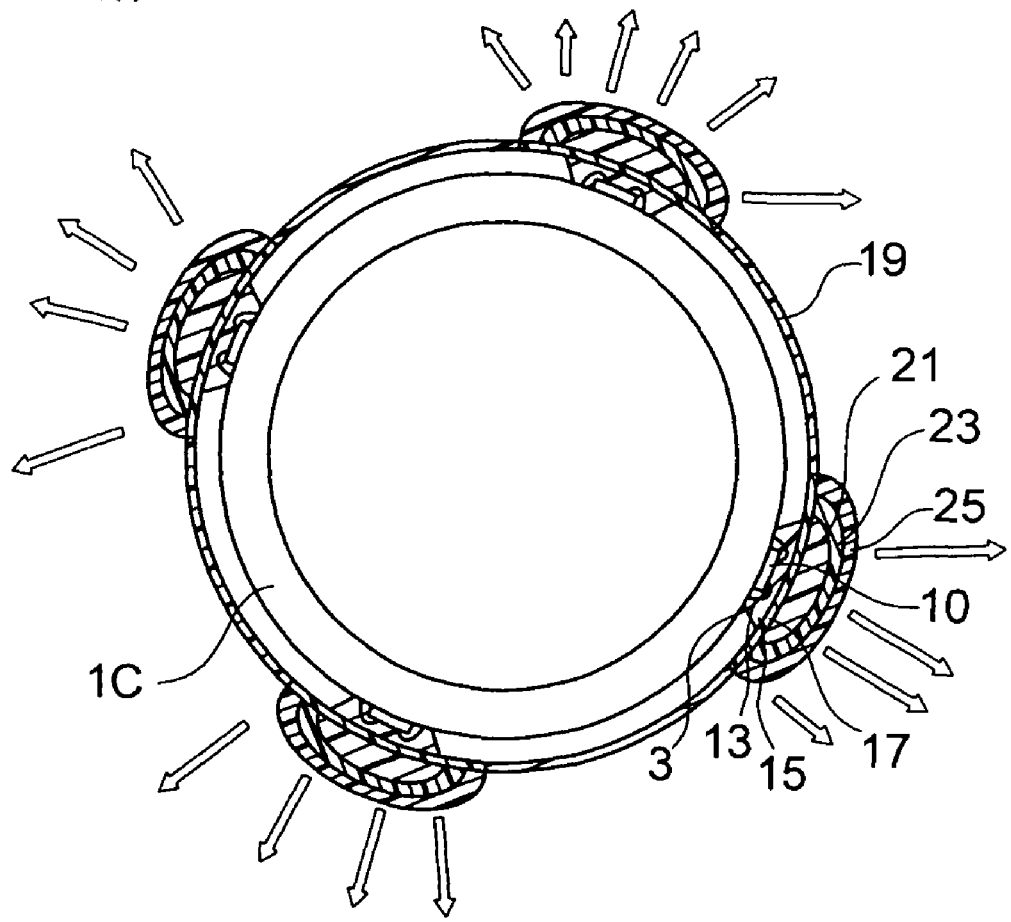
FIG. 9 is a cross-sectional view of a light emitting device in accordance with a fourth embodiment.

FIG. 9 shows a light emitting device in accordance with a fourth embodiment of the present invention. The light emitting device of this embodiment is the same as the light emitting device of the first embodiment shown in FIG. 1, except that the flat-type substrate 1 is replaced with a cylindrical substrate 1C. The cylindrical substrate 1C has concave portions 3 formed on the outer curved face side. Each LED chip 10 is resin-sealed in each corresponding concave portion 3. A deformable transparent resin sheet 17 is placed immediately above each LED chip 10, so as to cover the region above the resin 15. A reflection layer 19 is placed on the regions of the substrate 1 other than the regions on which the resin sheet 17 is provided. A material that reflects light in the near-ultraviolet to visible range, such as Ag particles or titanium oxide particles, is diffused in a resin of the reflection layer 19. Hemispherical transparent resin layers 21 are placed on the resin sheet 17. Each resin layer 21 is formed so that the center of the hemisphere of the hemispherical resin layer 21 is substantially located on the center line of the corresponding LED chip 10 that is substantially perpendicular to the upper face of the LED chip 10. A color conversion layer 23 is provided to cover the hemispherical resin layer 21. In the color conversion layer 23, a fluorescent material that absorbs and converts blue light emitted from the LED chip 10 into yellow light is diffused in a transparent resin. A transparent resin layer 25 is further provided to cover the color conversion layer 23. The outer surface of the resin layer 25 is in contact with the atmosphere (the air), and has a function to restrict total reflection of the yellow light from the color conversion layer 23 by the outer surface that is the interface with the atmosphere. The three-layer stack film formed with the resin layer 21, the color conversion layer 23, and the resin layer 25 has a hemispherical shape.

The light emitting device of the fourth embodiment can achieve the same effects as those of the first embodiment.

The substrates used in the first through fourth embodiments are a flat-type substrate, a concavely-curved substrate, a convexly-curved substrate, and a cylindrical substrate. In the cases where the substrate is not a flat-type substrate, it is difficult to apply a fluorescent material directly by a printing technique or the like. To counter this problem, the deformable resin sheet 17 is used in the first through fourth embodiments, and hemispherical three-layer stack films each including the resin layer 21, the color conversion layer 23, and the resin layer 25 are formed beforehand on the resin sheet 17. With the LED chips 10 being resin-sealed in the concave portions of the substrate, the resin sheet 17 having the stack films formed thereon beforehand is bonded to the substrate having the LED chips 10 resin-sealed in the concave portions. This method can be applied not only to flat-type substrate, concavely-curved substrates, convexly-curved substrates, and cylindrical substrates, but also to substrate of various other shapes.

For example, to form the hemispherical three-layer stack films each including the resin layer 21, the color conversion layer 23, and the resin layer 25 in the first through fourth embodiments, any method may be implemented, as long as a resin layer in which fluorescent materials are diffused from the excitation light source side to the greater fluorescent wavelength side can be stacked. Preferred manufacture methods are described in the following.

According to a first method, a resin in which fluorescent materials are diffused by a vacuum printing technique or the like as described above is prepared, and application, drying, and curing are repeated in this order, while the thickness of each layer is controlled. In this manner, any of the light emitting devices of the first through fourth embodiments can be formed.

According to a second method, different fluorescent materials for different emission colors are diffused in a binder resin such as silicone, and the resin containing the fluorescent materials is applied and dried for each layer with a dispenser, while the thickness of each film is controlled. In this manner, any of the light emitting devices in accordance with the first through fourth embodiments can be formed.

A combination of blue LEDs and a resin having a green fluorescent material and a red fluorescent material diffused therein can be employed in any of the above described light emitting devices in accordance with the first embodiment. Also, a combination of blue LEDs and a resin having several kinds of fluorescent materials diffused therein can be employed.

Example 1

Next, a method for manufacturing a light emitting device in accordance with Example 1 of the present invention is described.

First, blue LED chips (sixteen blue LED chips, for example) each having an activation layer made of an InGaN-based compound semiconductor and having a p-side electrode and an n-side electrode formed therein, or blue LED chips 10 each shown in one of FIGS. 2 to 5, are prepared. The blue LED chips 10 are fixed to the respective concave portions 3 of a flat-type mounting substrate 1 with the use of Sn—Ag—Cu paste. The mounting substrate 1 is a stack substrate formed with a Cu metal patterned to be a lead electrode and an insulating layer. The fixed LED chips 10 are connected so as to form the four-series, four-parallel structure shown in FIG. 6. At this point, the lead electrode on the anode side is electrically connected to the p-side electrode of each blue LED chip 10 with Au wires 13. The electric connections between the lead electrode on the cathode side and the n-side electrodes of the blue LED chips 10 are secured with Sn—Ag—Cu paste. After that, the LED chips 10 are sealed by silicone resin, and the Au wires 13 are protected.

A silicone-based thin-film resin sheet 17 that is transparent in the regions where the LED chips 10 are to be located, and has Ag particles diffused in the other regions is placed in a vacuum printing device. The resin sheet 17 has a thickness of 0.1 mm, and an adhesive agent is applied to only one side of the resin sheet 17. With the use of a metal mask of φ1 mm to φ3 mm in opening diameter, silicone-based transparent resin layers 21 each having a hemispherical shape are formed on the resin sheet 17 by a first-time printing process, while the silicone-based transparent resin is being defoamed under low pressure. After that, the resin sheet 17 having the resin layers 21 formed thereon, is left in the atmosphere under atmospheric pressure at 150° C. for 30 minutes. In this manner, the resin sheet 17 is hardened.

With the use of a metal mask having a slightly larger opening diameter than the metal mask used in the first-time printing process, resin layer 23 is formed in a hemispherical shape by a second-time printing process, so as to cover each entire hemispherical resin layer 21 formed in the first-time printing process. Each of the resin layers 23 has a uniform layer thickness and has a silicate-based yellow fluorescent material diffused in silicone resin that is a binder resin. After that, the resin sheet 17 is left in the atmosphere under atmospheric pressure at 150° C. for 30 minutes. In this manner, the resin sheet 17 is hardened. Accordingly, each stack film formed with the resin layer 21 and the resin layer 23 has a hemispherical shape.

With the use of a metal mask having a slightly larger opening diameter than the metal mask used in the second-time printing process, silicone-based transparent resin layers 25 of a uniform layer thickness are formed by a third-time printing process, so as to cover each resin layer formed in the second-time printing process. Through this printing process, each of the resin layers 25 is formed so that the ratio between the layer thickness a in the vertical direction of each LED chip and the layer thickness b in the horizontal direction (=a/b) becomes 1.0. After that, the resin layers 25 are left at 150° C. for 30 minutes, and are dried under atmospheric pressure. In this manner, the resin layers 25 formed in the third-time printing process are hardened, and multi-layer fluorescent material sheets are formed. Thus, each stack film formed with the resin layer 21, the resin layer 23, and the resin layer 25 has a hemispherical shape. After residual atmosphere is removed from the fluorescent material sheets in a low-pressure chamber, the fluorescent material sheets are bonded to the flat-type mounting substrate 1, so as to form the light emitting device shown in FIG. 1.

Comparative Example 1

Figure 10:
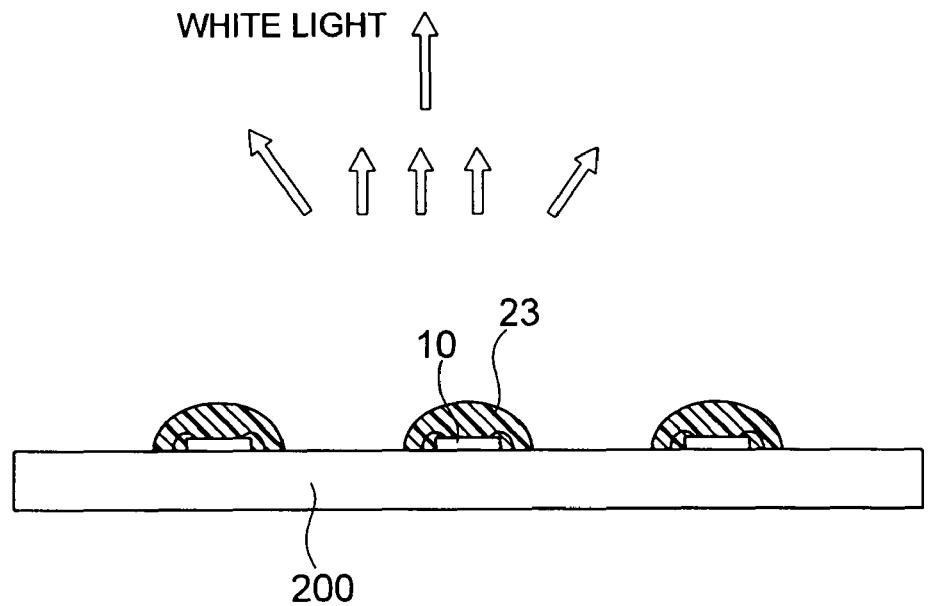
FIG. 10 is a cross-sectional view of a light emitting device in accordance with a comparative example 1.

As Comparative Example 1, the light emitting device shown in FIG. 10 is formed. In the light emitting device of Comparative Example 1, blue LED chips 10 are fixed onto a flat-type mounting substrate 200 with the use of Sn—Ag—Cu paste. The mounting substrate 200 is a stack substrate formed with a Cu metal patterned to be a lead electrode and an insulating layer. Resin layers 23 that have a silicate-based yellow fluorescent material diffused therein are formed so as to have a hemispherical shape and cover each LED chip 10. Although having a hemispherical shape, each resin layer of Comparative Example 1 is not a three-layer stack structure like each stack structure of Example 1, but is formed only with the resin layer 23.

Comparative Example 2

Figure 11:
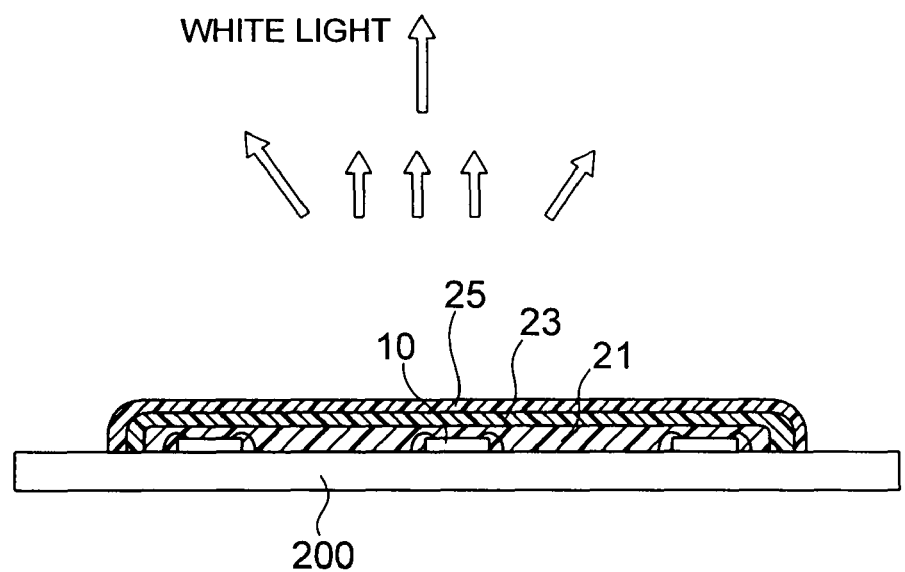
FIG. 11 is a cross-sectional view of a light emitting device in accordance with a comparative example 2.

As Comparative Example 2, the light emitting device shown in FIG. 11 is formed. In the light emitting device of Comparative Example 2, blue LED chips 10 are fixed onto a flat-type mounting substrate 200 with the use of Sn—Ag—Cu paste. The mounting substrate 200 is a stack substrate formed with a Cu metal patterned to be a lead electrode and an insulating layer. Three-layer resin stack film each formed with a transparent resin layer 21, a resin layer 23 containing a yellow fluorescent material, and a transparent resin layer 25 are formed on the entire surface of the substrate 200, so as to have a uniform layer thickness. Although Comparative Example 2 has resin stack films each having a three-layer stack structure as in Example 1, the shape of each of the resin stack films is not hemispherical like the shape of each stack film of Example 1.

The emission colors of the light emitting devices of Example 1, Comparative Example 1, and Comparative Example 2 formed in the above described manners are measured. When each of the light emitting devices is driven with a current of 800 mA, the chromaticity coordinates of the emission colors of Example 1, Comparative Example 1, and Comparative Example 2 are (0.32, 0.32), (0.32, 0.32), and (0.34, 0.35), which represent white color. In Example 1, however, the chromaticity coordinates represent white light emission without color shift, and its luminous flux and luminance efficiency are 500 (lm) and 38 (lm/W). In Comparative Example 1, on the other hand, some color shift is observed, and the luminous flux and the luminance efficiency are 400 (lm) and 30 (lm/W). In Comparative Example 2, the emitted light is white in the vicinity of each LED chip, but color shift is observed at the yellow light emitting portions between the LEDs. The luminous flux and the luminance efficiency are 450 (lm) and 34 (lm/W).

As can be seen from the above experiment results, in accordance with this example, a high-efficiency flat-type light emitting device with smaller color shift and higher luminance can be obtained. The light emitting device of this example is joined to a heat sink, and a continuous lighting test is carried out. As a result, a decrease in luminous flux due to heat accumulation can be restricted. Thus, the light emitting device of this example has smaller color shift, higher luminance, and higher efficiency, and excels in heat radiation.

Example 2

Next, a method for manufacturing a light emitting device in accordance with Example 2 of the present invention is described.

First, blue LED chips (sixteen blue LED chips, for example) each having an activation layer made of an InGaN-based compound semiconductor and having a p-side electrode and an n-side electrode formed therein, or blue LED chips 10 each shown in one of FIGS. 2 to 5, are prepared. The blue LED chips 10 are fixed to the respective concave portions 3 of a flat-type mounting substrate 1 with the use of Sn—Ag—Cu paste. The mounting substrate 1 is a stack substrate formed with an Al metal patterned to be a lead electrode and an insulating layer. The fixed LED chips 10 are connected so as to form the four-series, four-parallel structure shown in FIG. 6. At this point, the lead electrode on the anode side is electrically connected to the p-side electrode of each blue LED chip 10 with Au wires 13. The electric connections between the lead electrode on the cathode side and the n-side electrodes of the blue LED chips 10 are secured with Sn—Ag—Cu paste. After that, the LED chips 10 are sealed by silicone resin, and the Au wires 13 are protected.

A silicone-based thin-film resin sheet 17 that is transparent in the regions where the LED chips 10 are to be located, and has Ag particles diffused in the other regions is placed in a vacuum printing device. The resin sheet 17 has a thickness of 0.1 mm, and an adhesive agent is applied to only one side of the resin sheet 17. With the use of a metal mask of φ1 mm to φ3 mm in opening diameter, silicone-based transparent resin layers 21 each having a hemispherical shape are formed on the resin sheet 17 by a first-time printing process, while the silicone-based transparent resin is being defoamed under low pressure. After that, the resin sheet 17 having the resin layers 21 formed thereon is left in the atmosphere under atmospheric pressure at 150° C. for 30 minutes. In this manner, the resin sheet 17 is hardened.

With the use of a metal mask having a slightly larger opening diameter than the metal mask used in the first-time printing process, resin layers 23 are formed in a hemispherical shape by a second-time printing process, so as to cover each entire hemispherical resin layer 21 formed in the first-time printing process. Each of the resin layers 23 has a uniform layer thickness and has a silicate-based yellow fluorescent material diffused in silicone resin that is a binder resin. After that, the resin sheet 17 is left in the atmosphere under atmospheric pressure at 150° C. for 30 minutes. In this manner, the resin sheet 17 is hardened. Accordingly, each stack film formed with the resin layer 21 and the resin layer 23 has a hemispherical shape.

With the use of a metal mask having a slightly larger opening diameter than the metal mask used in the second-time printing process, silicone-based transparent resin layers 25 of a uniform layer thickness are formed by a third-time printing process, so as to cover the resin layer 23 formed in the second-time printing process. Through this printing process, each of the resin layers 25 is formed so that the ratio between the layer thickness a in the vertical direction of each LED chip and the layer thickness b in the horizontal direction (=a/b) becomes 1.0. After that, the resin layers 25 are left at 150° C. for 30 minutes, and are dried under atmospheric pressure. In this manner, the resin layers 25 formed in the third-time printing process are hardened, and multi-layer fluorescent material sheets are formed. Thus, each stack film formed with the resin layer 21, the resin layer 23, and the resin layer 25 has a hemispherical shape. After residual atmosphere is removed from the fluorescent material sheets in a low-pressure chamber, the fluorescent material sheets are bonded to the flat-type mounting substrate 1, so as to form the light emitting device shown in FIG. 1.

When the light emitting device of Example 2 formed in the above manner is driven with a current of 800 mA, the chromaticity coordinates of the emission color are (0.32, 0.32), which represent white color, and its luminous flux and luminance efficiency are 500 (lm) and 38 (lm/W). The light emitting device of this example is joined to a heat sink, and a continuous lighting test is carried out. As a result, a decrease in luminous flux due to heat accumulation can be restricted. Thus, the light emitting device of this example has smaller color shift, higher luminance, and higher efficiency, and excels in heat radiation.

Example 3

Next, a method for manufacturing a light emitting device in accordance with Example 3 of the present invention is described.

First, blue LED chips (sixteen blue LED chips, for example) each having an activation layer made of an InGaN-based compound semiconductor and having a p-side electrode and an n-side electrode formed therein, or blue LED chips 10 each shown in one of FIGS. 2 to 5, are prepared. The blue LED chips 10 are fixed to the respective concave portions 3 of a flat-type mounting substrate 1 with the use of Sn—Ag—Cu paste. The mounting substrate 1 is an AlN-based metallized substrate, with the AlN being patterned to be a lead electrode. The fixed LED chips 10 are connected so as to form the four-series, four-parallel structure shown in FIG. 6. At this point, the lead electrode on the anode side is electrically connected to the p-side electrode of each blue LED chip 10 with Au wires 13. The electric connections between the lead electrode on the cathode side and the n-side electrodes of the blue LED chips 10 are secured with Sn—Ag—Cu paste. After that, the LED chips 10 are sealed by silicone resin, and the Au wires 13 are protected.

A silicone-based thin-film resin sheet 17 that is transparent in the regions where the LED chips 10 are to be located, and has Ag particles diffused in the other regions is placed in a vacuum printing device. The resin sheet 17 has a thickness of 0.1 mm, and an adhesive agent is applied to only one side of the resin sheet 17. With the use of a metal mask of φ1 mm to φ3 mm in opening diameter, a silicone-based transparent resin layer 21 is formed in a hemispherical shape on the resin sheet 17 by a first-time printing process, while the silicone-based transparent resin is being defoamed under low pressure. After that, the resin sheet 17 having the resin layers 21 formed thereon is left in the atmosphere under atmospheric pressure at 150° C. for 30 minutes. In this manner, the resin sheet 17 is hardened.

With the use of a metal mask having a slightly larger opening diameter than the metal mask used in the first-time printing process, resin layers 23 are formed in a hemispherical shape by a second-time printing process, so as to cover each entire hemispherical resin layer 21 formed in the first-time printing process. Each of the resin layers 23 has a uniform layer thickness and has a silicate-based yellow fluorescent material diffused in silicone resin that is a binder resin. After that, the resin sheet 17 is left in the atmosphere under atmospheric pressure at 150° C. for 30 minutes. In this manner, the resin sheet 17 is hardened. Accordingly, each stack film formed with the resin layer 21 and the resin layer 23 has a hemispherical shape.

With the use of a metal mask having a slightly larger opening diameter than the metal mask used in the second-time printing process, hemispherical silicone-based transparent resin layers 25 of a uniform layer thickness are formed by a third-time printing process, so as to cover each resin layer 23 formed in the second-time printing process. Through this printing process, each of the resin layers 25 is formed so that the ratio between the layer thickness a in the vertical direction of each LED chip and the layer thickness b in the horizontal direction (=a/b) becomes 1.0. After that, the resin layers 25 are left at 150° C. for 30 minutes, and are dried under atmospheric pressure. In this manner, the resin layers 25 formed in the third-time printing process are hardened, and multi-layer fluorescent material sheets are formed. Thus, each stack film formed with the resin layer 21, the resin layer 23, and the resin layer 25 has a hemispherical shape. After residual atmosphere is removed from the fluorescent material sheets in a low-pressure chamber, the fluorescent material sheets are bonded to the flat-type mounting substrate 1, so as to form the light emitting device shown in FIG. 1.

When the light emitting device of Example 3 formed in the above manner is driven with a current of 800 mA, the chromaticity coordinates of the emission color are (0.32, 0.32), which represent white color, and its luminous flux and luminance efficiency are 450 (lm) and 34 (lm/W). The light emitting device of this example is joined to a heat sink, and a continuous lighting test is carried out. As a result, a decrease in luminous flux due to heat accumulation can be restricted. Thus, the light emitting device of this example has smaller color shift, higher luminance, and higher efficiency, and excels in heat radiation.

Example 4

Next, a method for manufacturing a light emitting device in accordance with Example 4 of the present invention is described.

First, blue LED chips (sixteen blue LED chips, for example) each having an activation layer made of an InGaN-based compound semiconductor and having a p-side electrode and an n-side electrode formed therein, or blue LED chips 10 each shown in one of FIGS. 2 to 5, are prepared. The blue LED chips 10 are fixed to the respective concave portions 3 of a flat-type mounting substrate 1 with the use of Au—Sn paste. The mounting substrate 1 is an AlN-based metallized substrate, with the AlN being patterned to be a lead electrode. The fixed LED chips 10 are connected so as to form the four-series, four-parallel structure shown in FIG. 6. At this point, the lead electrode on the anode side is electrically connected to the p-side electrode of each blue LED chip 10 with Au wires 13. The electric connections between the lead electrode on the cathode side and the n-side electrodes of the blue LED chips 10 are secured with Sn—Ag—Cu paste. After that, the LED chips 10 are sealed by silicone resin, and the Au wires 13 are protected.

A silicone-based thin-film resin sheet 17 that is transparent in the regions where the LED chips 10 are to be located, and has Ag particles diffused in the other regions is placed in a vacuum printing device. The resin sheet 17 has a thickness of 0.1 mm, and an adhesive agent is applied to only one side of the resin sheet 17. With the use of a metal mask of φ1 mm to φ3 mm in opening diameter, silicone-based transparent resin layers 21 each having a hemispherical shape are formed on the resin sheet 17 by a first-time printing process, while the silicone-based transparent resin is being defoamed under low pressure. After that, the resin sheet 17 having the resin layers 21 formed thereon is left in the atmosphere under atmospheric pressure at 150° C. for 30 minutes. In this manner, the resin sheet 17 is hardened.

With the use of a metal mask having a slightly larger opening diameter than the metal mask used in the first-time printing process, fluorescent material resin layers having a uniform layer thickness and having a silicate-based red fluorescent material diffused in silicone resin as a binder resin are formed, so as to cover each entire hemispherical resin layer 21 formed in the first-time printing process. With the use of a metal mask having a slightly larger opening diameter, fluorescent material resin layers having a uniform layer thickness and having a silicate-based yellow fluorescent material diffused in silicone resin that is a binder resin are formed on the fluorescent material resin layers having the red fluorescent material diffused therein. This is a second-time printing process. The resin sheets are then left under atmospheric pressure at 150° C. for 30 minutes, and are hardened. With the use of a metal mask having a slightly larger opening diameter, fluorescent material resin layers having a uniform layer thickness and having a green fluorescent material diffused in silicone resin are formed on the fluorescent material resin layers having the yellow fluorescent material diffused therein. This is a third-time printing process. The resin sheet 17 is left in the atmosphere under atmospheric pressure at 150° C. for 30 minutes. Thus, the resin sheet 17 is hardened every time a layer is formed thereon. Through those processes, fluorescent material resin films each having a stack structure formed with the fluorescent material resin layer having the red fluorescent material diffused therein, the fluorescent material resin layer having the yellow fluorescent material diffused therein, and the fluorescent material resin layer having the green fluorescent material diffused therein are formed. Accordingly, each stack film formed with the resin layer 21 and the fluorescent material resin films has a hemispherical shape.

With the use of a metal mask having a slightly larger opening diameter than the metal mask used in the third-time printing process, silicone-based transparent resin layers 25 having a uniform layer thickness are formed by a fourth-time printing process, so as to cover each resin film formed in the second-time printing process. Through this printing process, each of the resin layers 25 is formed so that the ratio between the layer thickness a in the vertical direction of each LED chip and the layer thickness b in the horizontal direction (=a/b) becomes 1.0. After that, the resin layers 25 are left at 150° C. for 30 minutes, and are dried under atmospheric pressure. In this manner, the resin layers 25 formed in the fourth-time printing process are hardened, and multi-layer fluorescent material sheets are formed. Thus, each stack film formed with the resin layer 21, the fluorescent material resin film, and the resin layer 25 has a hemispherical shape. After residual atmosphere is removed from the fluorescent material sheets in a low-pressure chamber, the fluorescent material sheets are bonded to the flat-type mounting substrate 1, so as to form the light emitting device shown in FIG. 1.

When the light emitting device of Example 4 formed in the above manner is driven with a current of 800 mA, the chromaticity coordinates of the emission color are (0.32, 0.32), which represent white color, and its luminous flux and luminance efficiency are 450 (lm) and 34 (lm/W). The light emitting device of this example is joined to a heat sink, and a continuous lighting test is carried out. As a result, a decrease in luminous flux due to heat accumulation can be restricted. Thus, the light emitting device of this example has smaller color shift, higher luminance, and higher efficiency, and excels in heat radiation.

Example 5

Next, a method for manufacturing a light emitting device in accordance with Example 5 of the present invention is described.

First, blue LED chips (sixteen blue LED chips, for example) each having an activation layer made of an InGaN-based compound semiconductor and having a p-side electrode and an n-side electrode formed therein, or blue LED chips 10 each shown in one of FIGS. 2 to 5, are prepared. The blue LED chips 10 are fixed to the respective concave portions 3 of a concavely-curved mounting substrate 1A with the use of Sn—Ag—Cu paste. The mounting substrate 1A is a stack substrate formed with a Cu-based metal patterned to be a lead electrode and an insulating layer. The fixed LED chips 10 are connected so as to form the four-series, four-parallel structure shown in FIG. 6. At this point, the lead electrode on the anode side is electrically connected to the p-side electrode of each blue LED chip 10 with Au wires 13. The electric connections between the lead electrode on the cathode side and the n-side electrodes of the blue LED chips 10 are secured with Sn—Ag—Cu paste. After that, the LED chips 10 are sealed by silicone resin, and the Au wires 13 are protected.

A silicone-based thin-film resin sheet 17 that is transparent in the regions where the LED chips 10 are to be located, and has radiation filler diffused in the other regions is placed in a vacuum printing device. The resin sheet 17 has a thickness of 0.1 mm, and an adhesive agent is applied to only one side of the resin sheet 17. With the use of a metal mask of φ1 mm to φ3 mm in opening diameter, silicone-based transparent resin layers 21 each having a hemispherical shape are formed on the resin sheet 17 by a first-time printing process, while the silicone-based transparent resin is being defoamed under low pressure. After that, the resin sheet 17 having the resin layers 21 formed thereon is left in the atmosphere under atmospheric pressure at 150° C. for 30 minutes. In this manner, the resin sheet 17 is hardened.

With the use of a metal mask having a slightly larger opening diameter than the metal mask used in the first-time printing process, resin layers 23 are formed by a second-time printing process, so as to cover each entire hemispherical resin layer 21 formed in the first-time printing process. Each of the resin layers 23 has a uniform layer thickness and has a garnet-based yellow fluorescent material diffused in silicone resin that is a binder resin. After that, the resin sheet 17 is left in the atmosphere under atmospheric pressure at 150° C. for 30 minutes. In this manner, the resin sheet 17 is hardened. Accordingly, each stack film formed with the resin layer 21 and the resin layer 23 has a hemispherical shape.

With the use of a metal mask having a slightly larger opening diameter than the metal mask used in the second-time printing process, hemispherical silicone-based transparent resin layers 25 of a uniform layer thickness are formed by a third-time printing process, so as to cover each resin layer formed in the second-time printing process. Through this printing process, each of the resin layers 25 is formed so that the ratio between the layer thickness a in the vertical direction of each LED chip and the layer thickness b in the horizontal direction (=a/b) becomes 1.0. After that, the resin layers 25 are left at 150° C. for 30 minutes, and are dried under atmospheric pressure. In this manner, the resin layers 25 formed in the third-time printing process are hardened, and multi-layer fluorescent material sheets are formed. Thus, each stack film formed with the resin layer 21, the resin layer 23, and the resin layer 25 has a hemispherical shape. After residual atmosphere is removed from the fluorescent material sheets in a low-pressure chamber, the fluorescent material sheets are bonded to the concavely-curved mounting substrate 1A, so as to form the light emitting device shown in FIG. 7.

Comparative Example 3

As Comparative Example 3, a light emitting device is formed. This light emitting device is the same as the light emitting device shown in FIG. 10, except that the flat-type substrate 200 is replaced with a concavely-curved substrate 1A. In the light emitting device of Comparative Example 3, blue LED chips 10 are fixed onto the concavely-curved mounting substrate 1A with the use of Sn—Ag—Cu paste. The mounting substrate 1A is a stack substrate formed with a Cu-based metal patterned to be a lead electrode and an insulating layer. Resin layers 23 that have a garnet-based yellow fluorescent material diffused therein are formed so as to have a hemispherical shape and cover each LED chip 10. Although having a hemispherical shape, each resin layer of Comparative Example 3 is not a three-layer stack structure like each stack structure of Example 5, but is formed only with the resin layer 23.

Comparative Example 4

As Comparative Example 4, a light emitting device is formed. This light emitting device is the same as the light emitting device shown in FIG. 11, except that the flat-type substrate 200 is replaced with a concavely-curved substrate 1A. In the light emitting device of Comparative Example 4, blue LED chips 10 are fixed onto the concavely-curved mounting substrate 1A with the use of Sn—Ag—Cu paste. The mounting substrate 1A is a stack substrate formed with a Cu-based metal patterned to be a lead electrode and an insulating layer. Three-layer resin stack films each formed with a transparent resin layer 21, a resin layer 23 containing a garnet-based yellow fluorescent material, and a transparent resin layer 25 are formed on the entire surface of the substrate 1A, so as to have a uniform layer thickness. Although Comparative Example 4 has resin stack films each having a three-layer stack structure as in Example 5, the shape of each of the resin stack films is not hemispherical like the shape of each stack film of Example 5.

The emission colors of the light emitting devices of Example 5, Comparative Example 3, and Comparative Example 4 formed in the above described manners are measured. When each of the light emitting devices is driven with a current of 800 mA, the chromaticity coordinates of the emission colors of Example 5, Comparative Example 3, and Comparative Example 4 are (0.31, 0.32), (0.31, 0.32), and (0.33, 0.34), which represent white color. In Example 5, however, the chromaticity coordinates represent white light emission without color shift, and its luminous flux and luminance efficiency are 480 (lm) and 36 (lm/W). In Comparative Example 3, on the other hand, some color shift is observed, and the luminous flux and the luminance efficiency are 400 (lm) and 30 (lm/W). In Comparative Example 4, the emitted light is white in the vicinity of each LED chip, but color shift is observed at the yellow light emitting portions between the LEDs. The luminous flux and the luminance efficiency are 450 (lm) and 34 (lm/W).

The light emitting device of this example is joined to a heat sink, and a continuous lighting test is carried out. As a result, a decrease in luminous flux due to heat accumulation can be restricted. Thus, the light emitting device of this example has smaller color shift, higher luminance, and higher efficiency, and excels in heat radiation. Furthermore, since the substrate has a concavely-curved surface, this example is characteristically suited for emitting spotlight, with the light distribution pattern being directed to the center.

Example 6

Next, a method for manufacturing a light emitting device in accordance with Example 6 of the present invention is described.

First, blue LED chips (sixteen blue LED chips, for example) each having an activation layer made of an InGaN-based compound semiconductor and having a p-side electrode and an n-side electrode formed therein, or blue LED chips 10 each shown in one of FIGS. 2 to 5, are prepared. The blue LED chips 10 are fixed to the respective concave portions 3 of a convexly-curved mounting substrate 1B with the use of Sn—Ag—Cu paste. The mounting substrate 1B is a stack substrate formed with a Cu-based metal patterned to be a lead electrode and an insulating layer. The fixed LED chips 10 are connected so as to form the four-series, four-parallel structure shown in FIG. 6. At this point, the lead electrode on the anode side is electrically connected to the p-side electrode of each blue LED chip 10 with Au wires 13. The electric connections between the lead electrode on the cathode side and the n-side electrodes of the blue LED chips 10 are secured with Sn—Ag—Cu paste. After that, the LED chips 10 are sealed by silicone resin, and the Au wires 13 are protected.

A silicone-based thin-film resin sheet 17 that is transparent in the regions where the LED chips 10 are to be located, and has radiation filler diffused in the other regions is placed in a vacuum printing device. The resin sheet 17 has a thickness of 0.1 mm, and an adhesive agent is applied to only one side of the resin sheet 17. With the use of a metal mask of φ1 mm to φ3 mm in opening diameter, silicone-based transparent resin layers 21 each having a hemispherical shape are formed on the resin sheet 17 by a first-time printing process, while the silicone-based transparent resin is being defoamed under low pressure. After that, the resin sheet 17 having the resin layers 21 formed thereon is left in the atmosphere under atmospheric pressure at 150° C. for 30 minutes. In this manner, the resin sheet 17 is hardened.

With the use of a metal mask having a slightly larger opening diameter than the metal mask used in the first-time printing process, resin layers 23 are formed by a second-time printing process, so as to cover each entire hemispherical resin layer 21 formed in the first-time printing process. Each of the resin layers 23 has a uniform layer thickness and has a garnet-based yellow fluorescent material diffused in silicone resin that is a binder resin. After that, the resin sheet 17 is left in the atmosphere under atmospheric pressure at 150° C. for 30 minutes. In this manner, the resin sheet 17 is hardened. Accordingly, each stack film formed with the resin layer 21 and the resin layer 23 has a hemispherical shape.

With the use of a metal mask having a slightly larger opening diameter than the metal mask used in the second-time printing process, silicone-based transparent resin layers 25 of a uniform layer thickness are formed by a third-time printing process, so as to cover each resin layer 23 formed in the second-time printing process. Through this printing process, each of the resin layers 25 is formed so that the ratio between the layer thickness a in the vertical direction of each LED chip and the layer thickness b in the horizontal direction (=a/b) becomes 1.0. After that, the resin layers 25 are left at 150° C. for 30 minutes, and are dried under atmospheric pressure. In this manner, the resin layers 25 formed in the third-time printing process are hardened, and multi-layer fluorescent material sheets are formed. Thus, each stack film formed with the resin layer 21, the resin layer 23, and the resin layer 25 has a hemispherical shape. After residual atmosphere is removed from the fluorescent material sheets in a low-pressure chamber, the fluorescent material sheets are bonded to the convexly-curved mounting substrate 1B, so as to form the light emitting device shown in FIG. 8.

Comparative Example 5

As Comparative Example 5, a light emitting device is formed. This light emitting device is the same as the light emitting device shown in FIG. 10, except that the flat-type substrate 200 is replaced with a convexly-curved substrate 1B. In the light emitting device of Comparative Example 5, blue LED chips 10 are fixed onto the convexly-curved mounting substrate 1B with the use of Sn—Ag—Cu paste. The mounting substrate 1B is a stack substrate formed with a Cu-based metal patterned to be a lead electrode and an insulating layer. Resin layers 23 that have a garnet-based yellow fluorescent material diffused therein are formed so as to have a hemispherical shape and cover each LED chip 10. Although having a hemispherical shape, each resin layer of Comparative Example 5 is not a three-layer stack structure like each stack structure of Example 6, but is formed only with the resin layer 23.

Comparative Example 6

As Comparative Example 6, a light emitting device is formed. This light emitting device is the same as the light emitting device shown in FIG. 11, except that the flat-type substrate 200 is replaced with a convexly-curved substrate 1B. In the light emitting device of Comparative Example 6, blue LED chips 10 are fixed onto the convexly-curved mounting substrate 1B with the use of Sn—Ag—Cu paste. The mounting substrate 1B is a stack substrate formed with a Cu-based metal patterned to be a lead electrode and an insulating layer. Three-layer resin stack films each formed with a transparent resin layer 21, a resin layer 23 containing a garnet-based yellow fluorescent material, and a transparent resin layer 25 are formed on the entire surface of the substrate 1B, so as to have a uniform layer thickness. Although Comparative Example 6 has resin stack films each having a three-layer stack structure as in Example 6, the shape of each of the resin stack films is not hemispherical like the shape of each stack film of Example 6.

The emission colors of the light emitting devices of Example 6, Comparative Example 5, and Comparative Example 6 formed in the above described manners are measured. When each of the light emitting devices is driven with a current of 800 mA, the chromaticity coordinates of the emission colors of Example 6, Comparative Example 5, and Comparative Example 6 are (0.32, 0.32), (0.32, 0.32), and (0.34, 0.35), which represent white color. In Example 6, however, the chromaticity coordinates represent white light emission without color shift, and its luminous flux and luminance efficiency are 480 (lm) and 36 (lm/W). In Comparative Example 5, on the other hand, some color shift is observed, and the luminous flux and the luminance efficiency are 400 (lm) and 30 (lm/W). In Comparative Example 6, the emitted light is white in the vicinity of each LED chip, but color shift is observed at the yellow light emitting portions between the LEDs. The luminous flux and the luminance efficiency are 450 (lm) and 34 (lm/W).

The light emitting device of this example is joined to a heat sink, and a continuous lighting test is carried out. As a result, a decrease in luminous flux due to heat accumulation can be restricted. Thus, the light emitting device of this example has smaller color shift, higher luminance, and higher efficiency, and excels in heat radiation. Furthermore, since the substrate has a convexly-curved surface, this example is characteristically suited for emitting spotlight, with the light distribution being made wider.

Example 7

Next, a method for manufacturing a light emitting device in accordance with Example 7 of the present invention is described.

First, blue LED chips (sixteen blue LED chips, for example) each having an activation layer made of an InGaN-based compound semiconductor and having a p-side electrode and an n-side electrode formed therein, or blue LED chips 10 each shown in one of FIGS. 2 to 5, are prepared. The blue LED chips 10 are fixed to the respective concave portions 3 of a cylindrical mounting substrate 1C with the use of Sn—Ag—Cu paste. The mounting substrate 1C is a stack substrate formed with a Cu-based metal patterned to be a lead electrode and an insulating layer. The fixed LED chips 10 are connected so as to form the four-series, four-parallel structure shown in FIG. 6. At this point, the lead electrode on the anode side is electrically connected to the p-side electrode of each blue LED chip 10 with Au wires 13. The electric connections between the lead electrode on the cathode side and the n-side electrodes of the blue LED chips 10 are secured with Sn—Ag—Cu paste. After that, the LED chips 10 are sealed by silicone resin, and the Au wires 13 are protected.

A silicone-based thin-film resin sheet 17 that is transparent in the regions where the LED chips 10 are to be located, and has Ag particles diffused in the other regions is prepared. The resin sheet 17 has a thickness of 0.1 mm. With the use of a dispenser having an adhesive agent applied only to one side thereof, silicone-based transparent resin layers 21 each having a hemispherical shape are formed on the resin sheet 17, while heating is performed at 150° C. in the atmosphere under atmospheric pressure. Here, the ratio between the thickness of the hemispherical shape in the vertical direction and the thickness of the hemispherical shape in the transverse direction is substantially 1:1. The resin sheet 17 having the resin layers 21 formed thereon is left in the atmosphere under atmospheric pressure at 150° C. for 10 to 90 minutes. In this manner, the resin sheet 17 is dried under atmospheric pressure.

With the use of a dispenser, resin layers 23 each having a silicate-based yellow fluorescent material diffused in silicone resin as a binder resin are formed, so as to cover each entire hemispherical resin layer 21. Each of the resin layers 23 has a uniform layer thickness. This layer application is carried out, while heating is performed at 150° C. in the atmosphere under atmospheric pressure. After that, the resin sheet 17 is left in the atmosphere under atmospheric pressure at 150° C. for 10 to 90 minutes. In this manner, the resin sheet 17 is dried under atmospheric pressure. Accordingly, each stack film formed with the resin layer 21 and the resin layer 23 has a hemispherical shape.

With the use of a dispenser, silicone-based transparent resin layers 25 of a uniform layer thickness are formed, so as to cover each resin layer 23. This layer application is carried out so that the ratio between the layer thickness a in the vertical direction of each LED chip and the layer thickness b in the horizontal direction (=a/b) becomes 1.0. This layer application is also carried out, while heating is performed at 150° C. in the atmosphere under atmospheric pressure. After that, the resin layers 25 are left at 150° C. for 10 to 90 minutes, and are dried under atmospheric pressure. In this manner, the resin layers 25 are hardened, and multi-layer fluorescent material sheets are formed. Thus, each stack film formed with the resin layer 21, the resin layer 23, and the resin layer 25 has a hemispherical shape. After residual atmosphere is removed from the fluorescent material sheets in a low-pressure chamber, the fluorescent material sheets are bonded to the cylindrical mounting substrate 1C, so as to form the light emitting device shown in FIG. 9.

Comparative Example 7

As Comparative Example 7, a light emitting device is formed. This light emitting device is the same as the light emitting device shown in FIG. 10, except that the flat-type substrate 200 is replaced with a cylindrical substrate 1C. In the light emitting device of Comparative Example 7, blue LED chips 10 are fixed onto the cylindrical mounting substrate 1C with the use of Sn—Ag—Cu paste. The mounting substrate 1C is a stack substrate formed with a Cu-based metal patterned to be a lead electrode and an insulating layer. Resin layers 23 that have a garnet-based yellow fluorescent material diffused therein are formed so as to have a hemispherical shape and cover each LED chip 10. Although having a hemispherical shape, each resin layer of Comparative Example 7 is not a three-layer stack structure like each stack structure of Example 7, but is formed only with the resin layer 23.

Comparative Example 8

As Comparative Example 8, a light emitting device is formed. This light emitting device is the same as the light emitting device shown in FIG. 11, except that the flat-type substrate 200 is replaced with a cylindrical substrate 1C. In the light emitting device of Comparative Example 8, blue LED chips 10 are fixed onto the cylindrical mounting substrate 1C with the use of Sn—Ag—Cu paste. The mounting substrate 1C is a stack substrate formed with a Cu-based metal patterned to be a lead electrode and an insulating layer. Three-layer resin stack films each formed with a transparent resin layer 21, a resin layer 23 containing a garnet-based yellow fluorescent material, and a transparent resin layer 25 are formed on the entire surface of the substrate 1C, so as to have a uniform layer thickness. Although Comparative Example 8 has resin stack films each having a three-layer stack structure as in Example 7, the shape of each of the resin stack films is not hemispherical like the shape of each stack film of Example 7.

The emission colors of the light emitting devices of Example 7, Comparative Example 7, and Comparative Example 8 formed in the above described manners are measured. When each of the light emitting devices is driven with a current of 800 mA, the chromaticity coordinates of the emission colors of Example 7, Comparative Example 7, and Comparative Example 8 are (0.32, 0.32), (0.32, 0.32), and (0.34, 0.35), which represent white color. In Example 7, however, the chromaticity coordinates represent white light emission without color shift, and its luminous flux and luminance efficiency are 490 (lm) and 37 (lm/W). In Comparative Example 7, on the other hand, some color shift is observed, and the luminous flux and the luminance efficiency are 400 (lm) and 30 (lm/W). In Comparative Example 8, the emitted light is white in the vicinity of each LED chip, but color shift is observed at the yellow light emitting portions between the LEDs. The luminous flux and the luminance efficiency are 450 (lm) and 34 (lm/W).

The light emitting device of this example is joined to a heat sink, and a continuous lighting test is carried out. As a result, a decrease in luminous flux due to heat accumulation can be restricted. Thus, the light emitting device of this example has smaller color shift, higher luminance, and higher efficiency, and excels in heat radiation. Furthermore, since the substrate has a cylindrical shape, it is possible to realize omnidirectional light emission for emitting light to a wider range than in the case of a convexly-curved substrate.

Example 8

Next, a method for manufacturing a light emitting device in accordance with Example 8 of the present invention is described.

First, blue LED chips (sixteen blue LED chips, for example) each having an activation layer made of an InGaN-based compound semiconductor and having a p-side electrode and an n-side electrode formed therein, or blue LED chips 10 each shown in one of FIGS. 2 to 5, are prepared. The blue LED chips 10 are fixed to the respective concave portions 3 of a flat-type mounting substrate 1 with the use of Sn—Ag—Cu paste. The mounting substrate 1 is a stack substrate formed with Al metal patterned to be a lead electrode and an insulating layer. The fixed LED chips 10 are connected so as to form the four-series, four-parallel structure shown in FIG. 6. At this point, the lead electrode on the anode side is electrically connected to the p-side electrode of each blue LED chip 10 with Au wires 13. The electric connections between the lead electrode on the cathode side and the n-side electrodes of the blue LED chips 10 are secured with Sn—Ag—Cu paste. After that, the LED chips 10 are sealed by silicone resin, and the Au wires 13 are protected.

A silicone-based thin-film resin sheet 17 that is transparent in the regions where the LED chips 10 are to be located, and has Ag particles diffused in the other regions is placed in a vacuum printing device. The resin sheet 17 has a thickness of 0.1 mm, and an adhesive agent is applied to only one side of the resin sheet 17. With the use of a metal mask of $\phi$1 mm to $\phi$3 mm in opening diameter, silicone-based transparent resin layers 21 each having a hemispherical shape are formed on the resin sheet 17 by a first-time printing process, while the silicone-based transparent resin is being defoamed under low pressure. After that, the resin sheet 17 having the resin layers 21 formed thereon is left in the atmosphere under atmospheric pressure at 150° C. for 30 minutes. In this manner, the resin sheet 17 is hardened.

With the use of a metal mask having a slightly larger opening diameter than the metal mask used in the first-time printing process, fluorescent material resin layers having a uniform layer thickness and having a nitride-based red fluorescent material diffused in silicone resin as a binder resin are formed by a second-time printing process, so as to cover each entire hemispherical resin layer 21 formed in the first-time printing process. The fluorescent material resin layers are then left in the atmosphere under atmospheric pressure at 150° C. for 30 minutes. In this manner, the fluorescent material resin layers are hardened. With the use of a metal mask having a slightly larger opening diameter, fluorescent material resin layers having a uniform layer thickness and having a silicate-based yellow fluorescent material diffused in silicone resin as a binder resin are formed on the fluorescent material resin layers having the red fluorescent material diffused therein. This is a third-time printing process. The resin sheet 17 is then left in the atmosphere under atmospheric pressure at 150° C. for 30 minutes. In this manner, the resin sheet 17 is hardened. Through those processes, fluorescent material resin films each having a stack structure formed with the fluorescent material resin layer having the red fluorescent material diffused therein and the fluorescent material resin layer having the yellow fluorescent material diffused therein are formed. Accordingly, each stack film formed with the resin layer 21 and the fluorescent material resin films has a hemispherical shape.

With the use of a metal mask having a slightly larger opening diameter than the metal mask used in the third-time printing process, hemispherical silicone-based transparent resin layers 25 of a uniform layer thickness are formed by a fourth-time printing process, so as to cover each fluorescent material resin film formed in the third-time printing process. Through this printing process, each of the resin layers 25 is formed so that the ratio between the layer thickness a in the vertical direction of each LED chip and the layer thickness b in the horizontal direction (=a/b) becomes 1.0. After that, the resin layers 25 are left at 150° C. for 30 minutes, and are dried under atmospheric pressure. In this manner, the resin layers 25 formed in the fourth-time printing process are hardened, and multi-layer fluorescent material sheets are formed. Thus, each stack film formed with the resin layer 21, the fluorescent material resin film, and the resin layer 25 has a hemispherical shape. After residual atmosphere is removed from the fluorescent material sheets in a low-pressure chamber, the fluorescent material sheets are bonded to the flat-type mounting substrate 1, so as to form the light emitting device shown in FIG. 1.

Comparative Example 9

As Comparative Example 9, the light emitting device shown in FIG. 10 is formed. In the light emitting device of Comparative Example 9, blue LED chips 10 are fixed onto a flat-type mounting substrate 200 with the use of Sn—Ag—Cu paste. The mounting substrate 200 is a stack substrate formed with a Cu-based metal patterned to be a lead electrode and an insulating layer. Fluorescent material resin layers each having a hemispherical shape and a nitride-based red fluorescent material diffused in silicon resin are formed so as to cover each LED chip 10. The fluorescent material resin layers are left in the atmosphere under atmospheric pressure at 150° C. for 30 minutes. Thus, the fluorescent material resin layers are hardened. With a metal mask having a slightly larger opening diameter, fluorescent material resin layers having a uniform layer thickness and having a silicate-based yellow fluorescent material diffused in silicone resin as a binder resin are formed on each of the fluorescent material resin layers having the red fluorescent material diffused therein. After that, the resin sheet 17 is left in the atmosphere under atmospheric pressure at 150° C. for 30 minutes. Thus, the resin sheet 17 is hardened. Through this process, fluorescent material resin films each having a stack structure formed with the fluorescent material resin layer having the red fluorescent material diffused therein and the fluorescent material resin layer having the yellow fluorescent material diffused therein are formed. Accordingly, each stack film formed with the fluorescent material resin films has a hemispherical shape. Although having a hemispherical shape, each resin layer of Comparative Example 9 is not a three-layer stack structure like each stack structure of Example 7, but is formed only with the two-layer fluorescent material resin films.

Comparative Example 10

As Comparative Example 10, the light emitting device shown in FIG. 11 is formed. In the light emitting device of Comparative Example 10, blue LED chips 10 are fixed onto a flat-type mounting substrate 200 with the use of Sn—Ag—Cu paste. The mounting substrate 200 is a stack substrate formed with an Al-based metal patterned to be a lead electrode and an insulating layer. Four-layer resin stack films each formed with a transparent resin layer 21, a fluorescent material resin layer containing a red fluorescent material, a fluorescent material resin layer containing a yellow fluorescent material, and a transparent resin layer 25 are formed on the entire surface of the substrate 200, so as to have a uniform layer thickness. Although Comparative Example 10 has resin stack films each having a four-layer stack structure as in Example 8, the shape of each of the resin stack films is not hemispherical like the shape of each stack film of Example 8.

The emission colors of the light emitting devices of Example 8, Comparative Example 9, and Comparative Example 10 formed in the above described manners are measured. When each of the light emitting devices is driven with a current of 800 mA, the chromaticity coordinates of the emission colors of Example 8, Comparative Example 9, and Comparative Example 10 are (0.45, 0.41), (0.43, 0.41), and (0.44, 0.41), which represent light bulb color. In Example 8, however, the chromaticity coordinates represent bulb-color light emission without color shift, and its luminous flux and luminance efficiency are 400 (lm) and 31 (lm/W). In Comparative Example 9, on the other hand, some color shift is observed, and the luminous flux and the luminance efficiency are 300 (lm) and 23 (lm/W). In Comparative Example 10, the emitted light has the light bulb color in the vicinity of each LED chip, but color shift is observed at the yellow light emitting portions between the LEDs. The luminous flux and the luminance efficiency are 333 (lm) and 26 (lm/W).

The light emitting device of this example is joined to a heat sink, and a continuous lighting test is carried out. As a result, a decrease in luminous flux due to heat accumulation can be restricted. Thus, the light emitting device of this example has smaller color shift, higher luminance, and higher efficiency, and excels in heat radiation.

Example 9

Next, a method for manufacturing a light emitting device in accordance with Example 9 of the present invention is described.

First, blue LED chips (sixteen blue LED chips, for example) each having an activation layer made of an InGaN-based compound semiconductor and having a p-side electrode and an n-side electrode formed therein, or blue LED chips 10 each shown in one of FIGS. 2 to 5, are prepared. The blue LED chips 10 are fixed to the respective concave portions 3 of a flat-type mounting substrate 1 with the use of Sn—Ag—Cu paste. The mounting substrate 1 is a stack substrate formed with Al metal patterned to be a lead electrode and an insulating layer. The fixed LED chips 10 are connected so as to form the four-series, four-parallel structure shown in FIG. 6. At this point, the lead electrode on the anode side is electrically connected to the p-side electrode of each blue LED chip 10 with Au wires 13. The electric connections between the lead electrode on the cathode side and the n-side electrodes of the blue LED chips 10 are secured with Sn—Ag—Cu paste. After that, the LED chips 10 are sealed by silicone resin, and the Au wires 13 are protected.

A silicone-based thin-film resin sheet 17 that is transparent in the regions where the LED chips 10 are to be located, and has radiation filler diffused in the other regions is placed in a vacuum printing device. The resin sheet 17 has a thickness of 0.1 mm, and an adhesive agent is applied to only one side of the resin sheet 17. With the use of a metal mask of φ1 mm to φ3 mm in opening diameter, silicone-based transparent resin layers 21 each having a hemispherical shape are formed on the resin sheet 17 by a first-time printing process, while the silicone-based transparent resin is being defoamed under low pressure. After that, the resin sheet 17 having the resin layers 21 formed thereon is left in the atmosphere under atmospheric pressure at 150° C. for 30 minutes. In this manner, the resin sheet 17 is hardened.

With the use of a metal mask having a slightly larger opening diameter than the metal mask used in the first-time printing process, fluorescent material resin layers having a uniform layer thickness and having a nitride-based red fluorescent material diffused in silicone resin as a binder resin are formed by a second-time printing process, so as to cover each entire hemispherical resin layer 21 formed in the first-time printing process. The fluorescent material resin layers are then left in the atmosphere under atmospheric pressure at 150° C. for 30 minutes. In this manner, the fluorescent material resin layers are hardened. With the use of a metal mask having a slightly larger opening diameter, fluorescent material resin layers having a uniform layer thickness and having a green fluorescent material diffused in silicone resin as a binder resin are formed on the fluorescent material resin layers each having the red fluorescent material diffused therein. This is a third-time printing process. The resin sheet 17 is then left in the atmosphere under atmospheric pressure at 150° C. for 30 minutes. In this manner, the resin sheet 17 is hardened. Through those processes, fluorescent material resin films each having a stack structure formed with the fluorescent material resin layer having the red fluorescent material diffused therein and the fluorescent material resin layer having the green fluorescent material diffused therein are formed. Accordingly, each stack film formed with the resin layer 21 and the fluorescent material resin films has a hemispherical shape.

With the use of a metal mask having a slightly larger opening diameter than the metal mask used in the third-time printing process, hemispherical silicone-based transparent resin layers 25 of a uniform layer thickness are formed by a fourth-time printing process, so as to cover each fluorescent material resin film formed in the third-time printing process. Through this printing process, each of the resin layers 25 is formed so that the ratio between the layer thickness a in the vertical direction of each LED chip and the layer thickness b in the horizontal direction (=a/b) becomes 1.0. After that, the resin layers 25 are left at 150° C. for 30 minutes, and are dried under atmospheric pressure. In this manner, the resin layers 25 formed in the fourth-time printing process are hardened, and multi-layer fluorescent material sheets are formed. Thus, each stack film formed with the resin layer 21, the fluorescent material resin films, and the resin layer 25 has a hemispherical shape. After residual atmosphere is removed from the fluorescent material sheets in a low-pressure chamber, the fluorescent material sheets are bonded to the flat-type mounting substrate 1, so as to form the light emitting device shown in FIG. 1.

The emission color of the light emitting device of Example 9 formed in the above manner is measured. When the light emitting device is driven with a current of 800 mA, the chromaticity coordinates of the emission color are (0.32, 0.32), which represent white color. In Example 9, the chromaticity coordinates represent white light emission without color shift, and its luminous flux and luminance efficiency are 400 (lm) and 31 (lm/W). By adding a color filter, a light emitting device that can be used as a LCD backlight having a NTSC ratio of 97% is obtained.

The light emitting device of this example is joined to a heat sink, and a continuous lighting test is carried out. As a result, a decrease in luminous flux due to heat accumulation can be restricted. Thus, the light emitting device of this example has smaller color shift, higher luminance, and higher efficiency, and excels in heat radiation.

Example 10

Next, a method for manufacturing a light emitting device in accordance with Example 10 of the present invention is described.

First, blue LED chips (sixteen blue LED chips, for example) each having an activation layer made of an InGaN-based compound semiconductor and having a p-side electrode and an n-side electrode formed therein, or blue LED chips 10 each shown in one of FIGS. 2 to 5, are prepared. The blue LED chips 10 are fixed to the respective concave portions 3 of a flat-type mounting substrate 1 with the use of Sn—Ag—Cu paste. The mounting substrate 1 is a stack substrate formed with Al metal patterned to be a lead electrode and an insulating layer. The fixed LED chips 10 are connected so as to form the four-series, four-parallel structure shown in FIG. 6. At this point, the lead electrode on the anode side is electrically connected to the p-side electrode of each blue LED chip 10 with Au wires 13. The electric connections between the lead electrode on the cathode side and the n-side electrodes of the blue LED chips 10 are secured with Sn—Ag—Cu paste. After that, the LED chips 10 are sealed by silicone resin, and the Au wires 13 are protected.

A silicone-based thin-film resin sheet 17 that is transparent in the regions where the LED chips 10 are to be located, and has radiation filler diffused in the other regions is placed in a vacuum printing device. The resin sheet 17 has a thickness of 0.1 mm, and an adhesive agent is applied to only one side of the resin sheet 17. With the use of a metal mask of φ1 mm to φ3 mm in opening diameter, silicone-based transparent resin layers 21 each having a hemispherical shape are formed on the resin sheet 17 by a first-time printing process, while the silicone-based transparent resin is being defoamed under low pressure. After that, the resin sheet 17 having the resin layers 21 formed thereon is left in the atmosphere under atmospheric pressure at 150° C. for 30 minutes. In this manner, the resin sheet 17 is hardened.

With the use of a metal mask having a slightly larger opening diameter than the metal mask used in the first-time printing process, fluorescent material resin layers having a uniform layer thickness and having a nitride-based red fluorescent material and a silicate-based yellow fluorescent material diffused in silicone resin as a binder resin are formed by a second-time printing process, so as to cover each entire hemispherical resin layer 21 formed in the first-time printing process. The fluorescent material resin layers are then left in the atmosphere under atmospheric pressure at 150° C. for 30 minutes. In this manner, the fluorescent material resin layers are hardened. With the use of a metal mask having a slightly larger opening diameter, fluorescent material resin layers having a uniform layer thickness and having a green fluorescent material diffused in silicone resin as a binder resin are formed on the fluorescent material resin layers each having the red fluorescent material and the yellow fluorescent material diffused therein. This is a third-time printing process. The resin sheet 17 is then left in the atmosphere under atmospheric pressure at 150° C. for 30 minutes. In this manner, the resin sheet 17 is hardened. Through those processes, fluorescent material resin films each having a stack structure formed with the fluorescent material resin layer having the red fluorescent material and the yellow fluorescent material diffused therein and the fluorescent material resin layer having the green fluorescent material diffused therein are formed. Accordingly, each stack film formed with the resin layer 21 and the fluorescent material resin films has a hemispherical shape.

With the use of a metal mask having a slightly larger opening diameter than the metal mask used in the third-time printing process, hemispherical silicone-based transparent resin layers 25 of a uniform layer thickness are formed by a fourth-time printing process, so as to cover each fluorescent material resin film formed in the third-time printing process. Through this printing process, each of the resin layers 25 is formed so that the ratio between the layer thickness a in the vertical direction of each LED chip and the layer thickness b in the horizontal direction (=a/b) becomes 1.0. After that, the resin layers 25 are left at 150° C. for 30 minutes, and are dried under atmospheric pressure. In this manner, the resin layers 25 formed in the fourth-time printing process are hardened, and multi-layer fluorescent material sheets are formed. Thus, each stack film formed with the resin layer 21, the fluorescent material resin films, and the resin layer 25 has a hemispherical shape. After residual atmosphere is removed from the fluorescent material sheets in a low-pressure chamber, the fluorescent material sheets are bonded to the flat-type mounting substrate 1, so as to form the light emitting device shown in FIG. 1.

The emission color of the light emitting device of Example 10 formed in the above manner is measured. When the light emitting device is driven with a current of 800 mA, the chromaticity coordinates of the emission color are (0.45, 0.41), which represent light bulb color. In Example 10, the chromaticity coordinates represent white light emission without color shift, and its luminous flux and luminance efficiency are 390 (lm) and 30 (lm/W).

The light emitting device of this example is joined to a heat sink, and a continuous lighting test is carried out. As a result, a decrease in luminous flux due to heat accumulation can be restricted. Thus, the light emitting device of this example has smaller color shift, higher luminance, and higher efficiency, and excels in heat radiation.

Example 11

Next, a method for manufacturing a light emitting device in accordance with Example 11 of the present invention is described.

First, blue LED chips (sixteen blue LED chips, for example) each having an activation layer made of an InGaN-based compound semiconductor and having a p-side electrode and an n-side electrode formed therein, or blue LED chips 10 each shown in one of FIGS. 2 to 5, are prepared. The blue LED chips 10 are fixed to the respective concave portions 3 of a flat-type mounting substrate 1 with the use of Sn—Ag—Cu paste. The mounting substrate 1 is a stack substrate formed with a Cu metal patterned to be a lead electrode and an insulating layer. The fixed LED chips 10 are connected so as to form the four-series, four-parallel structure shown in FIG. 6. At this point, the lead electrode on the anode side is electrically connected to the p-side electrode of each blue LED chip 10 with Au wires 13. The electric connections between the lead electrode on the cathode side and the n-side electrodes of the blue LED chips 10 are secured with Sn—Ag—Cu paste. After that, the LED chips 10 are sealed by silicone resin, and the Au wires 13 are protected.

A silicone-based thin-film resin sheet 17 that is transparent in the regions where the LED chips 10 are to be located, and has radiation filler diffused in the other regions is prepared. The resin sheet 17 has a thickness of 0.1 mm. With the use of a dispenser having an adhesive agent applied only to one side thereof, silicone-based transparent resin layers 21 each having a hemispherical shape are formed on the resin sheet 17, while heating is performed at 150° C. in the atmosphere under atmospheric pressure. Here, the ratio between the thickness of the hemispherical shape in the vertical direction and the thickness of the hemispherical shape in the transverse direction is substantially 1:1. The resin sheet 17 having the resin layers 21 formed thereon is left in the atmosphere under atmospheric pressure at 150° C. for 10 to 90 minutes. In this manner, the resin sheet 17 is dried under atmospheric pressure.

With the use of a dispenser, resin layers 23 each having a garnet-based yellow fluorescent material and a nitride-based red fluorescent material diffused in silicone resin as a binder resin are formed, so as to cover each entire hemispherical resin layer 21. Each of the resin layers 23 has a uniform layer thickness. This layer application is carried out, while heating is performed at 150° C. in the atmosphere under atmospheric pressure. After that, the resin sheet 17 is left in the atmosphere under atmospheric pressure at 150° C. for 10 to 90 minutes. In this manner, the resin sheet 17 is dried under atmospheric pressure. Accordingly, each stack film formed with the resin layer 21 and the resin layer 23 has a hemispherical shape.

With the use of a dispenser, silicone-based transparent resin layers 25 of a uniform layer thickness are formed, so as to cover each resin layer 23. This layer application is carried out so that the ratio between the layer thickness a in the vertical direction of each LED chip and the layer thickness b in the horizontal direction (=a/b) becomes 1.0. This layer application is also carried out, while heating is performed at 150° C. in the atmosphere under atmospheric pressure. After that, the resin layers 25 are left at 150° C. for 10 to 90 minutes, and are dried under atmospheric pressure. In this manner, the resin layers 25 are hardened, and multi-layer fluorescent material sheets are formed. Thus, each stack film formed with the resin layer 21, the resin layer 23, and the resin layer 25 has a hemispherical shape. After residual atmosphere is removed from the fluorescent material sheets in a low-pressure chamber, the fluorescent material sheets are bonded to the flat-type mounting substrate 1, so as to form the light emitting device shown in FIG. 1.

Comparative Example 11

As Comparative Example 11, the light emitting device shown in FIG. 10 is formed. In the light emitting device of Comparative Example 11, blue LED chips 10 are fixed onto a flat-type mounting substrate 200 with the use of Sn—Ag—Cu paste. The mounting substrate 200 is a stack substrate formed with a Cu metal patterned to be a lead electrode and an insulating layer. Resin layers 23 that have a garnet-based yellow fluorescent material and a nitride-based red fluorescent material diffused therein are formed so as to have a hemispherical shape and cover each LED chip 10. Although having a hemispherical shape, each resin layer of Comparative Example 11 is not a three-layer stack structure like each stack structure of Example 11, but is formed only with the resin layer 23.

Comparative Example 12

As Comparative Example 12, the light emitting device shown in FIG. 11 is formed. In the light emitting device of Comparative Example 12, blue LED chips 10 are fixed onto a flat-type mounting substrate 200 with the use of Sn—Ag—Cu paste. The mounting substrate 200 is a stack substrate formed with a Cu-based metal patterned to be a lead electrode and an insulating layer. Three-layer resin stack films each formed with a transparent resin layer 21, a resin layer 23 containing a garnet-based yellow fluorescent material and a nitride-based red fluorescent material, and a transparent resin layer 25 are formed on the entire surface of the substrate 200, so as to have a uniform layer thickness. Although Comparative Example 12 has resin stack films each having a three-layer stack structure as in Example 11, the shape of each of the resin stack films is not hemispherical like the shape of each stack film of Example 11.

The emission colors of the light emitting devices of Example 11, Comparative Example 11, and Comparative Example 12 formed in the above described manners are measured. When each of the light emitting devices is driven with a current of 800 mA, the chromaticity coordinates of the emission colors of Example 11, Comparative Example 11, and Comparative Example 12 are (0.45, 0.41), (0.43, 0.41), and (0.44, 0.41), which represent light bulb color. In Example 11, however, the chromaticity coordinates represent bulb-color light emission without color shift, and its luminous flux and luminance efficiency are 393 (lm) and 30 (lm/W). In Comparative Example 11, on the other hand, some color shift is observed, and the luminous flux and the luminance efficiency are 333 (lm) and 26 (lm/W). In Comparative Example 12, the emitted light has the light bulb color in the vicinity of each LED chip, but color shift is observed at the yellow light emitting portions between the LEDs. The luminous flux and the luminance efficiency are 300 (lm) and 23 (lm/W).

The light emitting device of this example is joined to a heat sink, and a continuous lighting test is carried out. As a result, a decrease in luminous flux due to heat accumulation can be restricted. Thus, the light emitting device of this example has smaller color shift, higher luminance, and higher efficiency, and excels in heat radiation.

Example 12

Next, a method for manufacturing a light emitting device in accordance with Example 12 of the present invention is described.

First, blue LED chips (sixteen blue LED chips, for example) each having an activation layer made of an InGaN-based compound semiconductor and having a p-side electrode and an n-side electrode formed therein, or blue LED chips 10 each shown in one of FIGS. 2 to 5, are prepared. The blue LED chips 10 are fixed to the respective concave portions 3 of a flat-type mounting substrate 1 with the use of Sn—Ag—Cu paste. The mounting substrate 1 is a stack substrate formed with a Cu metal patterned to be a lead electrode and an insulating layer. The fixed LED chips 10 are connected so as to form the four-series, four-parallel structure shown in FIG. 6. At this point, the lead electrode on the anode side is electrically connected to the p-side electrode of each blue LED chip 10 with Au wires 13. The electric connections between the lead electrode on the cathode side and the n-side electrodes of the blue LED chips 10 are secured with Sn—Ag—Cu paste. After that, the LED chips 10 are sealed by silicone resin, and the Au wires 13 are protected.

A silicone-based thin-film resin sheet 17 that is transparent in the regions where the LED chips 10 are to be located, and has radiation filler diffused in the other regions is prepared. The resin sheet 17 has a thickness of 0.1 mm. With the use of a dispenser having an adhesive agent applied only to one side thereof, silicone-based transparent resin layers 21 each having a hemispherical shape are formed on the resin sheet 17, while heating is performed at 150° C. in the atmosphere under atmospheric pressure. Here, the ratio between the thickness of the hemispherical shape in the vertical direction and the thickness of the hemispherical shape in the transverse direction is substantially 1:1. The resin sheet 17 having the resin layers 21 formed thereon is left in the atmosphere under atmospheric pressure at 150° C. for 10 to 90 minutes. In this manner, the resin sheet 17 is dried under atmospheric pressure.

With the use of a dispenser, resin layers 23 each having a green fluorescent material, a garnet-based yellow fluorescent material, and a nitride-based red fluorescent material diffused in silicone resin as a binder resin are formed, so as to cover each entire hemispherical resin layer 21. Each of the resin layers 23 has a uniform layer thickness. This layer application is carried out, while heating is performed at 150° C. in the atmosphere under atmospheric pressure. After that, the resin sheet 17 is left in the atmosphere under atmospheric pressure at 150° C. for 10 to 90 minutes. In this manner, the resin sheet 17 is dried under atmospheric pressure. Accordingly, each stack film formed with the resin layer 21 and the resin layer 23 has a hemispherical shape.

With the use of a dispenser, silicone-based transparent resin layers 25 of a uniform layer thickness are formed, so as to cover each resin layer 23. This layer application is carried out so that the ratio between the layer thickness a in the vertical direction of each LED chip and the layer thickness b in the horizontal direction (=a/b) becomes 1.0. This layer application is also carried out while heating is performed at 150° C. in the atmosphere under atmospheric pressure. After that, the resin layers 25 are left at 150° C. for 10 to 90 minutes, and are dried under atmospheric pressure. In this manner, the resin layers 25 are hardened, and multi-layer fluorescent material sheets are formed. Thus, each stack film formed with the resin layer 21, the resin layer 23, and the resin layer 25 has a hemispherical shape. After residual atmosphere is removed from the fluorescent material sheets in a low-pressure chamber, the fluorescent material sheets are bonded to the flat-type mounting substrate 1, so as to form the light emitting device shown in FIG. 1.

Comparative Example 13

As Comparative Example 13, the light emitting device shown in FIG. 10 is formed. In the light emitting device of Comparative Example 13, blue LED chips 10 are fixed onto a flat-type mounting substrate 200 with the use of Sn—Ag—Cu paste. The mounting substrate 200 is a stack substrate formed with a Cu metal patterned to be a lead electrode and an insulating layer. Resin layers 23 that have a green fluorescent material, a garnet-based yellow fluorescent material, and a nitride-based red fluorescent material diffused therein are formed so as to have a hemispherical shape and cover each LED chip 10. Although having a hemispherical shape, each resin layer of Comparative Example 13 is not a three-layer stack structure like each stack structure of Example 12, but is formed only with the resin layer 23.

Comparative Example 14

As Comparative Example 14, the light emitting device shown in FIG. 11 is formed. In the light emitting device of Comparative Example 14, blue LED chips 10 are fixed onto a flat-type mounting substrate 200 with the use of Sn—Ag—Cu paste. The mounting substrate 200 is a stack substrate formed with a Cu-based metal patterned to be a lead electrode and an insulating layer. Three-layer resin stack films each formed with a transparent resin layer 21, a resin layer 23 containing a green fluorescent material, a garnet-based yellow fluorescent material, and a nitride-based red fluorescent material, and a transparent resin layer 25 are formed on the entire surface of the substrate 200, so as to have a uniform layer thickness. Although Comparative Example 14 has resin stack films each having a three-layer stack structure as in Example 12, the shape of each of the resin stack films is not hemispherical like the shape of each stack film of Example 12.

The emission colors of the light emitting devices of Example 12, Comparative Example 13, and Comparative Example 14 formed in the above described manners are measured. When each of the light emitting devices is driven with a current of 800 mA, the chromaticity coordinates of the emission colors of Example 12, Comparative Example 13, and Comparative Example 14 are (0.32, 0.32), (0.32, 0.32), and (0.34, 0.35), which represent white color. In Example 12, however, the chromaticity coordinates represent white light emission without color shift, and its luminous flux and luminance efficiency are 500 (lm) and 38 (lm/W). In Comparative Example 13, on the other hand, some color shift is observed, and the luminous flux and the luminance efficiency are 400 (lm) and 30 (lm/W). In Comparative Example 14, the emitted light has white color in the vicinity of each LED chip, but color shift is observed at the yellow light emitting portions between the LEDs. The luminous flux and the luminance efficiency are 450 (lm) and 34 (lm/W).

The light emitting device of this example is joined to a heat sink, and a continuous lighting test is carried out. As a result, a decrease in luminous flux due to heat accumulation can be restricted. Thus, the light emitting device of this example has smaller color shift, higher luminance, and higher efficiency, and excels in heat radiation.

Example 13

Next, a method for manufacturing a light emitting device in accordance with Example 13 of the present invention is described.

First, blue LED chips (sixteen blue LED chips, for example) each having an activation layer made of an InGaN-based compound semiconductor and having a p-side electrode and an n-side electrode formed therein, or blue LED chips 10 each shown in one of FIGS. 2 to 5, are prepared. The blue LED chips 10 are fixed to the respective concave portions 3 of a flat-type mounting substrate 1 with the use of Sn—Ag—Cu paste. The mounting substrate 1 is a stack substrate formed with Al metal patterned to be a lead electrode and an insulating layer. The fixed LED chips 10 are connected so as to form the four-series, four-parallel structure shown in FIG. 6. At this point, the lead electrode on the anode side is electrically connected to the p-side electrode of each blue LED chip 10 with Au wires 13. The electric connections between the lead electrode on the cathode side and the n-side electrodes of the blue LED chips 10 are secured with Sn—Ag—Cu paste. After that, the LED chips 10 are sealed by silicone resin, and the Au wires 13 are protected.

A silicone-based thin-film resin sheet 17 that is transparent in the regions where the LED chips 10 are to be located, and has radiation filler diffused in the other regions is placed in a vacuum printing device. The resin sheet 17 has a thickness of 0.1 mm, and an adhesive agent is applied to only one side of the resin sheet 17. With the use of a metal mask of φ1 mm to φ3 mm in opening diameter, silicone-based transparent resin layers 21 each having a hemispherical shape are formed on the resin sheet 17 by a first-time printing process, while the silicone-based transparent resin is being defoamed under low pressure. After that, the resin sheet 17 having the resin layers 21 formed thereon is left in the atmosphere under atmospheric pressure at 150° C. for 30 minutes. In this manner, the resin sheet 17 is hardened.

With the use of a metal mask having a slightly larger opening diameter than the metal mask used in the first-time printing process, fluorescent material resin layers having a uniform layer thickness and having a nitride-based red fluorescent material diffused in silicone resin as a binder resin are formed by a second-time printing process, so as to cover each entire hemispherical resin layer 21 formed in the first-time printing process. The fluorescent material resin layers are then left in the atmosphere under atmospheric pressure at 150° C. for 30 minutes. In this manner, the fluorescent material resin layers are hardened. With the use of a metal mask having a slightly larger opening diameter, transparent resin layers that are formed with silicone resin as a binder resin and have a uniform layer thickness are formed by a third-time printing process on each fluorescent material resin layers having the red fluorescent material diffused therein, so as to prevent the red fluorescent material from reabsorbing emitted fluorescent light and cover each entire red fluorescent material resin layer. The transparent resin layers are then left in the atmosphere under atmospheric pressure at 150° C. for 30 minutes. In this manner, the transparent resin layers are hardened. With the use of a metal mask having a slightly larger opening diameter, fluorescent material resin layers having a uniform layer thickness and having a green fluorescent material diffused therein are formed by a fourth-time printing process on the transparent resin layer. The resin sheet 17 is then left in the atmosphere under atmospheric pressure at 150° C. for 30 minutes. In this manner, the resin sheet 17 is hardened. Through those processes, fluorescent material resin films each having a stack structure formed with a fluorescent material resin layer having a red fluorescent material diffused therein, a transparent resin layer, and a fluorescent material resin layer having a green fluorescent material diffused therein are formed. Accordingly, each stack film formed with the resin layer 21 and the fluorescent material resin films has a hemispherical shape.

With the use of a metal mask having a slightly larger opening diameter than the metal mask used in the fourth-time printing process, hemispherical silicone-based transparent resin layers 25 of a uniform layer thickness are formed by a fifth-time printing process, so as to cover each fluorescent material resin film formed in the fourth-time printing process. Through this printing process, each of the resin layers 25 is formed so that the ratio between the layer thickness a in the vertical direction of each LED chip and the layer thickness b in the horizontal direction (=a/b) becomes 1.0. After that, the resin layers 25 are left at 150° C. for 30 minutes, and are dried under atmospheric pressure. In this manner, the resin layers 25 formed in the fifth-time printing process are hardened, and multi-layer fluorescent material sheets are formed. Thus, each stack film formed with the resin layer 21, the fluorescent material resin films, and the resin layer 25 has a hemispherical shape. After residual atmosphere is removed from the fluorescent material sheets in a low-pressure chamber, the fluorescent material sheets are bonded to the flat-type mounting substrate 1, so as to form the light emitting device shown in FIG. 1.

The emission color of the light emitting device of Example 13 formed in the above manner is measured. When the light emitting device is driven with a current of 800 mA, the chromaticity coordinates of the emission color are (0.32, 0.32), which represent white color. In Example 13, the chromaticity coordinates represent white light emission without color shift, and its luminous flux and luminance efficiency are 420 (lm) and 32 (lm/W). By adding a color filter, a light emitting device that can be used as a LCD backlight having a NTSC ratio of 97% is obtained.

The light emitting device of this example is joined to a heat sink, and a continuous lighting test is carried out. As a result, a decrease in luminous flux due to heat accumulation can be restricted. Thus, the light emitting device of this example has smaller color shift, higher luminance, and higher efficiency, and excels in heat radiation.

Example 14

Next, a method for manufacturing a light emitting device in accordance with Example 14 of the present invention is described.

First, blue LED chips (sixteen blue LED chips, for example) each having an activation layer made of an InGaN-based compound semiconductor and having a p-side electrode and an n-side electrode formed therein, or blue LED chips 10 each shown in one of FIGS. 2 to 5, are prepared. The blue LED chips 10 are fixed to the respective concave portions 3 of a flat-type mounting substrate 1 with the use of Sn—Ag—Cu paste. The mounting substrate 1 is a stack substrate formed with Al metal patterned to be a lead electrode and an insulating layer. The fixed LED chips 10 are connected so as to form the four-series, four-parallel structure shown in FIG. 6. At this point, the lead electrode on the anode side is electrically connected to the p-side electrode of each blue LED chip 10 with Au wires 13. The electric connections between the lead electrode on the cathode side and the n-side electrodes of the blue LED chips 10 are secured with Sn—Ag—Cu paste. After that, the LED chips 10 are sealed by silicone resin, and the Au wires 13 are protected.

A silicone-based thin-film resin sheet 17 that is transparent in the regions where the LED chips 10 are to be located, and has radiation filler diffused in the other regions is placed in a vacuum printing device. The resin sheet 17 has a thickness of 0.1 mm, and an adhesive agent is applied to only one side of the resin sheet 17. With the use of a metal mask of φ1 mm to φ3 mm in opening diameter, silicone-based transparent resin layers 21 each having a hemispherical shape are formed on the resin sheet 17 by a first-time printing process, while the silicone-based transparent resin is being defoamed under low pressure. After that, the resin sheet 17 having the resin layers 21 formed thereon is left in the atmosphere under atmospheric pressure at 150° C. for 30 minutes. In this manner, the resin sheet 17 is hardened.

With the use of a metal mask having a slightly larger opening diameter than the metal mask used in the first-time printing process, fluorescent material resin layers having a uniform layer thickness and having a nitride-based red fluorescent material diffused in silicone resin as a binder resin are formed by a second-time printing process, so as to cover each entire hemispherical resin layer 21 formed in the first-time printing process. The fluorescent material resin layers are then left in the atmosphere under atmospheric pressure at 150° C. for 30 minutes. In this manner, the fluorescent material resin layers are hardened. With the use of a metal mask having a slightly larger opening diameter, transparent resin layers that are formed only with silicone resin and have a uniform layer thickness are formed by a third-time printing process on the fluorescent material resin layers having the red fluorescent material diffused therein, so as to prevent the red fluorescent material from reabsorbing emitted fluorescent light. The transparent resin layers are then left in the atmosphere under atmospheric pressure at 150° C. for 30 minutes. In this manner, the transparent resin layers are hardened. Fluorescent material resin layers having a uniform layer thickness and having a silicate-based yellow fluorescent material diffused in silicone resin as a binder resin are formed by a fourth-time printing process. The resin sheet 17 is then left in the atmosphere under atmospheric pressure at 150° C. for 30 minutes. In this manner, the resin sheet 17 is hardened. Through those processes, fluorescent material resin films each having a stack structure formed with a transparent resin layer, a red fluorescent material layer, another transparent resin layer, and a fluorescent material resin layer having a silicate-based yellow fluorescent material diffused therein are formed. Accordingly, each stack film formed with the resin layer 21 and the fluorescent material resin films has a hemispherical shape.

With the use of a metal mask having a slightly larger opening diameter than the metal mask used in the fourth-time printing process, hemispherical silicone-based transparent resin layers 25 of a uniform layer thickness are formed by a fifth-time printing process, so as to cover each fluorescent material resin film formed in the fourth-time printing process. Through this printing process, each of the resin layers 25 is formed so that the ratio between the layer thickness a in the vertical direction of each LED chip and the layer thickness b in the horizontal direction (=a/b) becomes 1.0. After that, the resin layers 25 are left at 150° C. for 30 minutes, and are dried under atmospheric pressure. In this manner, the resin layers 25 formed in the fifth-time printing process are hardened, and multi-layer fluorescent material sheets are formed. Thus, each stack film formed with the resin layer 21, the fluorescent material resin films, and the resin layer 25 has a hemispherical shape. After residual atmosphere is removed from the fluorescent material sheets in a low-pressure chamber, the fluorescent material sheets are bonded to the flat-type mounting substrate 1, so as to form the light emitting device shown in FIG. 1.

The emission color of the light emitting device of Example 14 formed in the above manner is measured. When the light emitting device is driven with a current of 800 mA, the chromaticity coordinates of the emission color are (0.45, 0.41), which represent light bulb color. In Example 14, the chromaticity coordinates represent bulb-color light emission without color shift, and its luminous flux and luminance efficiency are 440 (lm) and 34 (lm/W).

The light emitting device of this example is joined to a heat sink, and a continuous lighting test is carried out. As a result, a decrease in luminous flux due to heat accumulation can be restricted. Thus, the light emitting device of this example has smaller color shift, higher luminance, and higher efficiency, and excels in heat radiation.

Example 15

Next, a method for manufacturing a light emitting device in accordance with Example 15 of the present invention is described.

First, blue LED chips (sixteen blue LED chips, for example) each having an activation layer made of an InGaN-based compound semiconductor and having a p-side electrode and an n-side electrode formed therein, or blue LED chips 10 each shown in one of FIGS. 2 to 5, are prepared. The blue LED chips 10 are fixed to the respective concave portions 3 of a flat-type mounting substrate 1 with the use of Sn—Ag—Cu paste. The mounting substrate 1 is a stack substrate formed with Al metal patterned to be a lead electrode and an insulating layer. The fixed LED chips 10 are connected so as to form the four-series, four-parallel structure shown in FIG. 6. At this point, the lead electrode on the anode side is electrically connected to the p-side electrode of each blue LED chip 10 with Au wires 13. The electric connections between the lead electrode on the cathode side and the n-side electrodes of the blue LED chips 10 are secured with Sn—Ag—Cu paste. After that, the LED chips 10 are sealed by silicone resin, and the Au wires 13 are protected.

A silicone-based thin-film resin sheet 17 that is transparent in the regions where the LED chips 10 are to be located, and has radiation filler diffused in the other regions is placed in a vacuum printing device. The resin sheet 17 has a thickness of 0.1 mm, and an adhesive agent is applied to only one side of the resin sheet 17. With the use of a metal mask of $\phi 1$ mm to $\phi 3$ mm in opening diameter, silicone-based transparent resin layers 21 each having a hemispherical shape are formed on the resin sheet 17 by a first-time printing process, while the silicone-based transparent resin is being defoamed under low pressure. After that, the resin sheet 17 having the resin layers 21 formed thereon is left in the atmosphere under atmospheric pressure at 150° C. for 30 minutes. In this manner, the resin sheet 17 is hardened.

With the use of a metal mask having a slightly larger opening diameter than the metal mask used in the first-time printing process, fluorescent material resin layers having a uniform layer thickness and having a nitride-based red fluorescent material diffused in silicone resin as a binder resin are formed by a second-time printing process, so as to cover each entire hemispherical resin layer 21 formed in the first-time printing process. The fluorescent material resin layers are then left in the atmosphere under atmospheric pressure at 150° C. for 30 minutes. In this manner, the fluorescent material resin layers are hardened. With the use of a metal mask having a slightly larger opening diameter, transparent resin layers that are formed only with silicone resin and have a uniform layer thickness are formed by a third-time printing process on the fluorescent material resin layers having the red fluorescent material diffused therein, so as to prevent the red fluorescent material from reabsorbing emitted fluorescent light. The transparent resin layers are then left in the atmosphere under atmospheric pressure at 150° C. for 30 minutes. In this manner, the transparent resin layers are hardened. Fluorescent material resin layers having a uniform layer thickness and having a silicate-based yellow fluorescent material diffused in silicone resin as a binder resin are formed by a fourth-time printing process. The resin sheet 17 is then left in the atmosphere under atmospheric pressure at 150° C. for 30 minutes. In this manner, the resin sheet 17 is hardened. Fluorescent material resin layers having a uniform layer thickness and having a green fluorescent material diffused in silicone resin as a binder resin are formed by a fifth-time printing process. The resin sheet 17 is then left in the atmosphere under atmospheric pressure at 150° C. for 30 minutes. In this manner, the resin sheet 17 is hardened. Through those processes, fluorescent material resin films each having a stack structure formed with a transparent resin layer, a red fluorescent material layer, another transparent resin layer, and fluorescent material resin layers having a yellow fluorescent material and a green fluorescent material diffused therein are formed. Accordingly, each stack film formed with the resin layer 21 and the fluorescent material resin films has a hemispherical shape.

With the use of a metal mask having a slightly larger opening diameter than the metal mask used in the fifth-time printing process, hemispherical silicone-based transparent resin layers 25 of a uniform layer thickness are formed by a sixth-time printing process, so as to cover each fluorescent material resin film formed in the fifth-time printing process. Through this printing process, each of the resin layers 25 is formed so that the ratio between the layer thickness a in the vertical direction of each LED chip and the layer thickness b in the horizontal direction (=a/b) becomes 1.0. After that, the resin layers 25 are left at 150° C. for 30 minutes, and are dried under atmospheric pressure. In this manner, the resin layers 25 formed in the sixth-time printing process are hardened, and multi-layer fluorescent material sheets are formed. Thus, each stack film formed with the resin layer 21, the fluorescent material resin films, and the resin layer 25 has a hemispherical shape. After residual atmosphere is removed from the fluorescent material sheets in a low-pressure chamber, the fluorescent material sheets are bonded to the flat-type mounting substrate 1, so as to form the light emitting device shown in FIG. 1.

The emission color of the light emitting device of Example 15 formed in the above manner is measured. When the light emitting device is driven with a current of 800 mA, the chromaticity coordinates of the emission color are (0.32, 0.32), which represent white color. In Example 15, the chromaticity coordinates represent white light emission without color shift, and its luminous flux and luminance efficiency are 430 (lm) and 33 (lm/W).

The light emitting device of this example is joined to a heat sink, and a continuous lighting test is carried out. As a result, a decrease in luminous flux due to heat accumulation can be restricted. Thus, the light emitting device of this example has smaller color shift, higher luminance, and higher efficiency, and excels in heat radiation.

Example 16

Next, a method for manufacturing a light emitting device in accordance with Example 16 of the present invention is described.

First, near-ultraviolet LED chips (sixteen near-ultraviolet LED chips, for example) each having an activation layer made of an InGaN-based compound semiconductor and having a p-side electrode and an n-side electrode formed therein, or near-ultraviolet LED chips 10 each shown in one of FIGS. 2 to 5, are prepared. The near-ultraviolet LED chips 10 are fixed to the respective concave portions 3 of a flat-type mounting substrate 1 with the use of Sn—Ag—Cu paste. The mounting substrate 1 is a stack substrate formed with Al metal patterned to be a lead electrode and an insulating layer. The fixed LED chips 10 are connected so as to form the four-series, four-parallel structure shown in FIG. 6. At this point, the lead electrode on the anode side is electrically connected to the p-side electrode of each near-ultraviolet LED chip 10 with Au wires 13. The electric connections between the lead electrode on the cathode side and the n-side electrodes of the near-ultraviolet LED chips 10 are secured with Sn—Ag—Cu paste. After that, the LED chips 10 are sealed by silicone resin, and the Au wires 13 are protected.

A silicone-based thin-film resin sheet 17 that is transparent in the regions where the LED chips 10 are to be located, and has radiation filler diffused in the other regions is placed in a vacuum printing device. The resin sheet 17 has a thickness of 0.1 mm, and an adhesive agent is applied to only one side of the resin sheet 17. With the use of a metal mask of φ1 mm to φ3 mm in opening diameter, silicone-based transparent resin layers 21 each having a hemispherical shape are formed on the resin sheet 17 by a first-time printing process, while the silicone-based transparent resin is being defoamed under low pressure. After that, the resin sheet 17 having the resin layers 21 formed thereon is left in the atmosphere under atmospheric pressure at 150° C. for 30 minutes. In this manner, the resin sheet 17 is hardened.

With the use of a metal mask having a slightly larger opening diameter than the metal mask used in the first-time printing process, fluorescent material resin layers having a uniform layer thickness and having a nitride-based red fluorescent material diffused in silicone resin as a binder resin are formed by a second-time printing process, so as to cover each entire hemispherical resin layer 21 formed in the first-time printing process. The fluorescent material resin layers are then left in the atmosphere under atmospheric pressure at 150° C. for 30 minutes. In this manner, the fluorescent material resin layers are hardened. With the use of a metal mask having a slightly larger opening diameter, transparent resin layers that are formed only with silicone resin and have a uniform layer thickness are formed by a third-time printing process on the fluorescent material resin layers having the red fluorescent material diffused therein, so as to prevent the red fluorescent material from reabsorbing emitted fluorescent light. The transparent resin layers are then left in the atmosphere under atmospheric pressure at 150° C. for 30 minutes. In this manner, the transparent resin layers are hardened. Fluorescent material resin layers having a uniform layer thickness and having a silicate-based yellow fluorescent material diffused in silicone resin as a binder resin are formed by a fourth-time printing process. The resin sheet 17 is then left in the atmosphere under atmospheric pressure at 150° C. for 30 minutes. In this manner, the resin sheet 17 is hardened. Fluorescent material resin layers having a uniform layer thickness and having a phosphoric-acid-based blue-green fluorescent material diffused in silicone resin as a binder resin are formed by a fifth-time printing process. The resin sheet 17 is then left in the atmosphere under atmospheric pressure at 150° C. for 30 minutes. In this manner, the resin sheet 17 is hardened. Fluorescent material resin layers having a uniform layer thickness and having an oxide-based blue fluorescent material diffused in silicone resin as a binder resin are formed by a sixth-time printing process. The resin sheet 17 is then left in the atmosphere under atmospheric pressure at 150° C. for 30 minutes. In this manner, the resin sheet 17 is hardened. Through those processes, fluorescent material resin films each having a stack structure formed with a transparent resin layer, a red fluorescent material layer, another transparent resin layer, and fluorescent material resin layers having a yellow fluorescent material, a bluish-green fluorescent material, and a blue fluorescent material diffused therein are formed. Accordingly, each stack film formed with the resin layer 21 and the fluorescent material resin films has a hemispherical shape.

With the use of a metal mask having a slightly larger opening diameter than the metal mask used in the sixth-time printing process, hemispherical silicone-based transparent resin layers 25 of a uniform layer thickness are formed by a seventh-time printing process, so as to cover each fluorescent material resin film formed in the sixth-time printing process. Through this printing process, each of the resin layers 25 is formed so that the ratio between the layer thickness a in the vertical direction of each LED chip and the layer thickness b in the horizontal direction (=a/b) becomes 1.0. After that, the resin layers 25 are left at 150° C. for 30 minutes, and are dried under atmospheric pressure. In this manner, the resin layers 25 formed in the seventh-time printing process are hardened, and multi-layer fluorescent material sheets are formed. Thus, each stack film formed with the resin layer 21, the fluorescent material resin films, and the resin layer 25 has a hemispherical shape. After residual atmosphere is removed from the fluorescent material sheets in a low-pressure chamber, the fluorescent material sheets are bonded to the flat-type mounting substrate 1, so as to form the light emitting device shown in FIG. 1.

The emission color of the light emitting device of Example 16 formed in the above manner is measured. When the light emitting device is driven with a current of 800 mA, the chromaticity coordinates of the emission color are (0.33, 0.33), which represent white color. In Example 16, the chromaticity coordinates represent white light emission without color shift, and its luminous flux and luminance efficiency are 350 (lm) and 27 (lm/W).

The light emitting device of this example is joined to a heat sink, and a continuous lighting test is carried out. As a result, a decrease in luminous flux due to heat accumulation can be restricted. Thus, the light emitting device of this example has smaller color shift, higher luminance, and higher efficiency, and excels in heat radiation.

Example 17

Next, a method for manufacturing a light emitting device in accordance with Example 17 of the present invention is described.

First, near-ultraviolet LED chips (sixteen near-ultraviolet LED chips, for example) each having an activation layer made of an InGaN-based compound semiconductor and having a p-side electrode and an n-side electrode formed therein, or near-ultraviolet LED chips 10 each shown in one of FIGS. 2 to 5, are prepared. The near-ultraviolet LED chips 10 are fixed to the respective concave portions 3 of a concavely-curved mounting substrate 1A with the use of Sn—Ag—Cu paste. The mounting substrate 1A is a stack substrate formed with Al metal patterned to be a lead electrode and an insulating layer. The fixed LED chips 10 are connected so as to form the four-series, four-parallel structure shown in FIG. 6. At this point, the lead electrode on the anode side is electrically connected to the p-side electrode of each near-ultraviolet LED chip 10 with Au wires 13. The electric connections between the lead electrode on the cathode side and the n-side electrodes of the near-ultraviolet LED chips 10 are secured with Sn—Ag—Cu paste. After that, the LED chips 10 are sealed by silicone resin, and the Au wires 13 are protected.

A silicone-based thin-film resin sheet 17 that is transparent in the regions where the LED chips 10 are to be located, and has radiation filler diffused in the other regions is placed in a vacuum printing device. The resin sheet 17 has a thickness of 0.1 mm, and an adhesive agent is applied to only one side of the resin sheet 17. With the use of a metal mask of φ1 mm to φ3 mm in opening diameter, silicone-based transparent resin layers 21 each having a hemispherical shape are formed on the resin sheet 17 by a first-time printing process, while the silicone-based transparent resin is being defoamed under low pressure. After that, the resin sheet 17 having the resin layers 21 formed thereon is left in the atmosphere under atmospheric pressure at 150° C. for 30 minutes. In this manner, the resin sheet 17 is hardened.

With the use of a metal mask having a slightly larger opening diameter than the metal mask used in the first-time printing process, fluorescent material resin layers having a uniform layer thickness and having a nitride-based red fluorescent material diffused in silicone resin as a binder resin are formed by a second-time printing process, so as to cover each entire hemispherical resin layer 21 formed in the first-time printing process. The fluorescent material resin layers are then left in the atmosphere under atmospheric pressure at 150° C. for 30 minutes. In this manner, the fluorescent material resin layers are hardened. With the use of a metal mask having a slightly larger opening diameter, transparent resin layers that are formed only with silicone resin and have a uniform layer thickness are formed by a third-time printing process on the fluorescent material resin layers having the red fluorescent material diffused therein, so as to prevent the red fluorescent material from reabsorbing emitted fluorescent light. The transparent resin layers are then left in the atmosphere under atmospheric pressure at 150° C. for 30 minutes. In this manner, the transparent resin layers are hardened. Fluorescent material resin layers having a uniform layer thickness and having a silicate-based yellow fluorescent material diffused in silicone resin as a binder resin are formed by a fourth-time printing process. The resin sheet 17 is then left in the atmosphere under atmospheric pressure at 150° C. for 30 minutes. In this manner, the resin sheet 17 is hardened. Fluorescent material resin layers having a uniform layer thickness and having a phosphoric-acid-based blue-green fluorescent material diffused in silicone resin as a binder resin are formed by a fifth-time printing process. The resin sheet 17 is then left in the atmosphere under atmospheric pressure at 150° C. for 30 minutes. In this manner, the resin sheet 17 is hardened. Fluorescent material resin layers having a uniform layer thickness and having an oxide-based blue fluorescent material diffused in silicone resin as a binder resin are formed by a sixth-time printing process. The resin sheet 17 is then left in the atmosphere under atmospheric pressure at 150° C. for 30 minutes. In this manner, the resin sheet 17 is hardened. Through those processes, fluorescent material resin films each having a stack structure formed with a transparent resin layer, a red fluorescent material layer, another transparent resin layer, and fluorescent material resin layers having a yellow fluorescent material, a bluish-green fluorescent material, and a blue fluorescent material diffused therein are formed. Accordingly, each stack film formed with the resin layer 21 and the fluorescent material resin films has a hemispherical shape.

With the use of a metal mask having a slightly larger opening diameter than the metal mask used in the sixth-time printing process, hemispherical silicone-based transparent resin layers 25 of a uniform layer thickness are formed by a seventh-time printing process, so as to cover each fluorescent material resin film formed in the sixth-time printing process. Through this printing process, each of the resin layers 25 is formed so that the ratio between the layer thickness a in the vertical direction of each LED chip and the layer thickness b in the horizontal direction (=a/b) becomes 1.0. After that, the resin layers 25 are left at 150° C. for 30 minutes, and are dried under atmospheric pressure. In this manner, the resin layers 25 formed in the seventh-time printing process are hardened, and multi-layer fluorescent material sheets are formed. Thus, each stack film formed with the resin layer 21, the fluorescent material resin films, and the resin layer 25 has a hemispherical shape. After residual atmosphere is removed from the fluorescent material sheets in a low-pressure chamber, the fluorescent material sheets are bonded to the concavely-curved mounting substrate 1A, so as to form the light emitting device shown in FIG. 7.

The emission color of the light emitting device of Example 17 formed in the above manner is measured. When the light emitting device is driven with a current of 800 mA, the chromaticity coordinates of the emission color are (0.33, 0.33), which represent white color. In Example 17, the chromaticity coordinates represent white light emission without color shift, and its luminous flux and luminance efficiency are 345 (lm) and 27 (lm/W).

The light emitting device of this example is joined to a heat sink, and a continuous lighting test is carried out. As a result, a decrease in luminous flux due to heat accumulation can be restricted. Thus, the light emitting device of this example has smaller color shift, higher luminance, and higher efficiency, and excels in heat radiation.

Example 18

Next, a method for manufacturing a light emitting device in accordance with Example 18 of the present invention is described.

First, near-ultraviolet LED chips (sixteen near-ultraviolet LED chips, for example) each having an activation layer made of an InGaN-based compound semiconductor and having a p-side electrode and an n-side electrode formed therein, or near-ultraviolet LED chips 10 each shown in one of FIGS. 2 to 5, are prepared. The near-ultraviolet LED chips 10 are fixed to the respective concave portions 3 of a convexly-curved mounting substrate 1B with the use of Sn—Ag—Cu paste. The mounting substrate 1B is a stack substrate formed with Al metal patterned to be a lead electrode and an insulating layer. The fixed LED chips 10 are connected so as to form the four-series, four-parallel structure shown in FIG. 6. At this point, the lead electrode on the anode side is electrically connected to the p-side electrode of each near-ultraviolet LED chip 10 with Au wires 13. The electric connections between the lead electrode on the cathode side and the n-side electrodes of the near-ultraviolet LED chips 10 are secured with Sn—Ag—Cu paste. After that, the LED chips 10 are sealed by silicone resin, and the Au wires 13 are protected.

A silicone-based thin-film resin sheet 17 that is transparent in the regions where the LED chips 10 are to be located, and has radiation filler diffused in the other regions is placed in a vacuum printing device. The resin sheet 17 has a thickness of 0.1 mm, and an adhesive agent is applied to only one side of the resin sheet 17. With the use of a metal mask of φ1 mm to φ3 mm in opening diameter, silicone-based transparent resin layers 21 each having a hemispherical shape are formed on the resin sheet 17 by a first-time printing process, while the silicone-based transparent resin is being defoamed under low pressure. After that, the resin sheet 17 having the resin layers 21 formed thereon is left in the atmosphere under atmospheric pressure at 150° C. for 30 minutes. In this manner, the resin sheet 17 is hardened.

With the use of a metal mask having a slightly larger opening diameter than the metal mask used in the first-time printing process, fluorescent material resin layers having a uniform layer thickness and having a nitride-based red fluorescent material diffused in silicone resin as a binder resin are formed by a second-time printing process, so as to cover each entire hemispherical resin layer 21 formed in the first-time printing process. The fluorescent material resin layers are then left in the atmosphere under atmospheric pressure at 150° C. for 30 minutes. In this manner, the fluorescent material resin layers are hardened. With the use of a metal mask having a slightly larger opening diameter, transparent resin layers that are formed only with silicone resin and have a uniform layer thickness are formed by a third-time printing process on the fluorescent material resin layers having the red fluorescent material diffused therein, so as to prevent the red fluorescent material from reabsorbing emitted fluorescent light. The transparent resin layers are then left in the atmosphere under atmospheric pressure at 150° C. for 30 minutes. In this manner, the transparent resin layers are hardened. Fluorescent material resin layers having a uniform layer thickness and having a silicate-based yellow fluorescent material diffused in silicone resin as a binder resin are formed by a fourth-time printing process. The resin sheet 17 is then left in the atmosphere under atmospheric pressure at 150° C. for 30 minutes. In this manner, the resin sheet 17 is hardened. Fluorescent material resin layers having a uniform layer thickness and having a phosphoric-acid-based blue-green fluorescent material diffused in silicone resin as a binder resin are formed by a fifth-time printing process. The resin sheet 17 is then left in the atmosphere under atmospheric pressure at 150° C. for 30 minutes. In this manner, the resin sheet 17 is hardened. Fluorescent material resin layers having a uniform layer thickness and having an oxide-based blue fluorescent material diffused in silicone resin as a binder resin are formed by a sixth-time printing process. The resin sheet 17 is then left in the atmosphere under atmospheric pressure at 150° C. for 30 minutes. In this manner, the resin sheet 17 is hardened. Through those processes, fluorescent material resin films each having a stack structure formed with a transparent resin layer, a red fluorescent material layer, another transparent resin layer, and fluorescent material resin layers having a yellow fluorescent material, a blue-green fluorescent material, and a blue fluorescent material diffused therein are formed. Accordingly, each stack film formed with the resin layer 21 and the fluorescent material resin films has a hemispherical shape.

With the use of a metal mask having a slightly larger opening diameter than the metal mask used in the sixth-time printing process, hemispherical silicone-based transparent resin layers 25 of a uniform layer thickness are formed by a seventh-time printing process, so as to cover each fluorescent material resin film formed in the sixth-time printing process. Through this printing process, each of the resin layers 25 is formed so that the ratio between the layer thickness a in the vertical direction of each LED chip and the layer thickness b in the horizontal direction (=a/b) becomes 1.0. After that, the resin layers 25 are left at 150° C. for 30 minutes, and are dried under atmospheric pressure. In this manner, the resin layers 25 formed in the seventh-time printing process are hardened, and multi-layer fluorescent material sheets are formed. Thus, each stack film formed with the resin layer 21, the fluorescent material resin films, and the resin layer 25 has a hemispherical shape. After residual atmosphere is removed from the fluorescent material sheets in a low-pressure chamber, the fluorescent material sheets are bonded to the convexly-curved mounting substrate 1B, so as to form the light emitting device shown in FIG. 8.

The emission color of the light emitting device of Example 18 formed in the above manner is measured. When the light emitting device is driven with a current of 800 mA, the chromaticity coordinates of the emission color are (0.33, 0.33), which represent white color. In Example 18, the chromaticity coordinates represent white light emission without color shift, and its luminous flux and luminance efficiency are 343 (lm) and 26 (lm/W).

The light emitting device of this example is joined to a heat sink, and a continuous lighting test is carried out. As a result, a decrease in luminous flux due to heat accumulation can be restricted. Thus, the light emitting device of this example has smaller color shift, higher luminance, and higher efficiency, and excels in heat radiation.

The light emitting elements that emit excitation light and are used in the light emitting devices of the present invention are semiconductor light emitting elements that emit ultraviolet or blue light. Although LEDs using gallium-nitride compound semiconductor have been described in the embodiments and examples, but the present invention is not limited to such LEDs.

In cases where blue LEDs are used as light emitting elements, the fluorescent material is not limited to a yellow-light emitting fluorescent material, a combination of a yellow fluorescent material and a red fluorescent material, a combination of a red fluorescent material and a green fluorescent material, and a combination of a red fluorescent material, a yellow fluorescent material, and a green fluorescent material, but may be a combination of an orange fluorescent material and a green fluorescent material, a combination of a red fluorescent material and a bluish-green fluorescent material, or a combination of an orange fluorescent material and a blue-green fluorescent material. In cases where near-ultraviolet LEDs are used as light emitting elements, the fluorescent material may be a combination of a red fluorescent material, a green fluorescent material, and a blue fluorescent material, a combination of a red fluorescent material, a yellow fluorescent material, a green fluorescent material, and a blue fluorescent material, or the like. In cases where two or more kinds of fluorescent materials are used, it is preferable to form a multi-layer structure by applying a long-wavelength light emitting fluorescent material to the inside and applying a short-wavelength light emitting fluorescent material to the outside, so as to prevent reabsorption between the fluorescent materials. It is more preferable to form a multi-layer structure by interposing a transparent resin layer between the long-wavelength light emitting fluorescent material and the short-wavelength light emitting fluorescent material.

The binder resin serving as the base material of the sealing resin may be of any kind, as long as it is substantially transparent in the neighborhood of the peak wavelength of the light emitting elements (or excitation elements) and in the regions of longer wavelengths than the peak wavelength of the light emitting elements. Typical examples of such binder resins include silicone resin, epoxy resin, polydimethylsiloxane derivative containing an epoxy group, oxetane resin, acrylic resin, cycloolefin resin, urea resin, fluororesin, polyimide resin, or the likes.

As described so far, in accordance with an embodiment or an example of the present invention, the emission patterns can have particular distributions, and reductions in the resin transmission rate and the luminance efficiency of the fluorescent materials can be minimized. Thus, high-intensity light can be output with highest possible luminance efficiency.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A light emitting device comprising:
   a substrate that has a concave portion formed on a surface thereof;
   a light emitting element that is sealed in the concave portion of the substrate by resin, and emits a first light which is a blue light or a near-ultraviolet light;
   a deformable resin sheet formed on the substrate so as to cover the light emitting element sealed in the concave portion by the resin, the resin sheet having a first region which transmits the first light and a second region other than the first region, and the second region containing at least one of a material reflecting the first light and a heat-radiating filler;
   a first transmissive layer that is formed in a hemispherical shape on the first region of the resin sheet, and transmits the first light;
   a color conversion layer that includes a fluorescent material that converts the first light into a second light of a different wavelength from that of the first light and a transmissive material that transmits the first light, the color conversion layer covering the first transmissive layer in such a manner that an end portion reaches an upper face of the resin sheet; and
   a second transmissive layer that covers the color conversion layer in such a manner that an end portion reaches the upper face of the resin sheet, and transmits the first light and the second light,
   wherein the first transmissive layer, the color conversion layer, and the second transmissive layer form a hemispherical stack structure in the first region of the resin sheet.

2. The device according to claim 1, wherein the surface of the substrate having the concave portion formed thereon is a flat face.

3. The device according to claim 1, wherein the surface of the substrate having the concave portion formed thereon is a concavely-curved face.

4. The device according to claim 1, wherein the surface of the substrate having the concave portion formed thereon is a convexly-curved face.

5. The device according to claim 1, wherein the substrate is a hollow cylinder, and the surface of the substrate having the concave portion formed thereon is an outer surface of the cylinder.

6. The device according to claim 1, wherein a face of the second transmissive layer on the opposite side from the color conversion layer reduces the loss due to total reflection of the both the first light and the second light.

7. The device according to claim 1, wherein the color conversion layer contains a plurality of types of fluorescent materials.

8. A light emitting device comprising:
   a substrate that has a plurality of concave portions formed on a surface thereof;
   light emitting elements that are sealed in the concave portions of the substrate by resin, and emit first lights which are blue lights or near-ultraviolet lights;
   a deformable resin sheet formed on the substrate so as to cover each of the light emitting elements sealed in the concave portions by the resin, the resin sheet having first regions which transmit the first lights and second regions other than the first regions, and each of the second regions containing at least one of a material reflecting the first lights and a heat-radiating filler;
   first transmissive layers that are formed in hemispherical shapes on the first regions of the resin sheet, and transmit the first lights;
   color conversion layers that include a fluorescent material that converts the first lights into second lights of different wavelengths from those of the first lights and a transmissive material that transmits the first lights, the color conversion layers covering the first transmissive layers in such a manner that each end portion reaches an upper face of the resin sheet; and
   second transmissive layers that cover the color conversion layers in such a manner that each end portion reaches the upper face of the resin sheet, and transmit the first lights and the second lights, wherein the first transmissive layers, the color conversion layers, and the second transmissive layers form hemispherical stack structures in the first regions of the resin sheet.

9. The device according to claim 8, wherein the surface of the substrate having the concave portions formed thereon is a flat face.

10. The device according to claim 8, wherein the surface of the substrate having the concave portions formed thereon is a concavely-curved face.

11. The device according to claim 8, wherein the surface of the substrate having the concave portions formed thereon is a convexly-curved face.

12. The device according to claim 8, wherein the substrate is a hollow cylinder, and the surface of the substrate having the concave portions formed thereon is an outer surface of the cylinder.

13. The device according to claim 8, wherein faces of the second transmissive layers on the opposite side from the color conversion layers reduce the loss due to total reflection of the both the first lights and the second lights.

14. The device according to claim 8, wherein the color conversion layers contain a plurality of types of fluorescent materials.

* * * * *